United States Patent [19]
Sato et al.

[11] Patent Number: 5,267,177
[45] Date of Patent: Nov. 30, 1993

[54] METHOD FOR VLSI LAYOUT PATTERN COMPACTION BY USING DIRECT ACCESS MEMORY

[75] Inventors: Koichi Sato; Masahiko Toyonaga; Toshiro Akino, all of Osaka, Japan

[73] Assignee: Matsushita Electric Industrial Co., Ltd., Japan

[21] Appl. No.: 686,461

[22] Filed: Apr. 17, 1991

[30] Foreign Application Priority Data

Apr. 17, 1990 [JP]  Japan ................................. 2-101283

[51] Int. Cl.⁵ ............................................ G06F 15/60
[52] U.S. Cl. .................................. 364/491; 364/490; 364/489; 364/488
[58] Field of Search ................. 364/488, 489, 490, 491

[56] References Cited

U.S. PATENT DOCUMENTS 4,500,963  2/1985  Smith et al. ........................ 364/491
4,965,739  10/1990  Ng ...................................... 364/491
5,079,717  1/1992  Miwa .................................. 364/490

OTHER PUBLICATIONS

"A Hierarchical Routing System for VLSIs Including Large Macros" by Hiwatashi et al., *IEEE 1986 Cust. Integrated* Circuits Conf., pp. 235-238.
"An Over-All Gate Array Channel Router" by Krohn, *IEEE 20th Design Automation Conf.*, 1983, pp. 665-670.
"Compaction Based Custom LSI Layout Design Method" by Ishikawa et al., *IEEE International Conference on Computer-Aided Design*, Nov. 1985, pp. 343-345.
Xiao-Ming Xiong and Ernest S. Kuh, "Nutcracker: An Efficient and Intelligent Channel Spacer" 24th ACM-/IEEE Digest Automation Conference, Paper 17.2, 1987, pp. 298-304.

*Primary Examiner*—Vincent N. Trans
*Attorney, Agent, or Firm*—Lowe, Price, LeBlanc & Becker

[57] ABSTRACT

A method for layout compaction which comprises steps of establishing storage areas in a direct access memory as a boundary information memory to which geometrical information on boundaries of a layout is written, searching layout elements of groups adjoining the boundaries of the layout and performing a processing of packing layout elements in a bottom boundary region of the layout and of packing layout elements in a top boundary region of the layout by using the boundary information memory. Thereby, a compaction of the layout can be performed at a high speed.

7 Claims, 23 Drawing Sheets

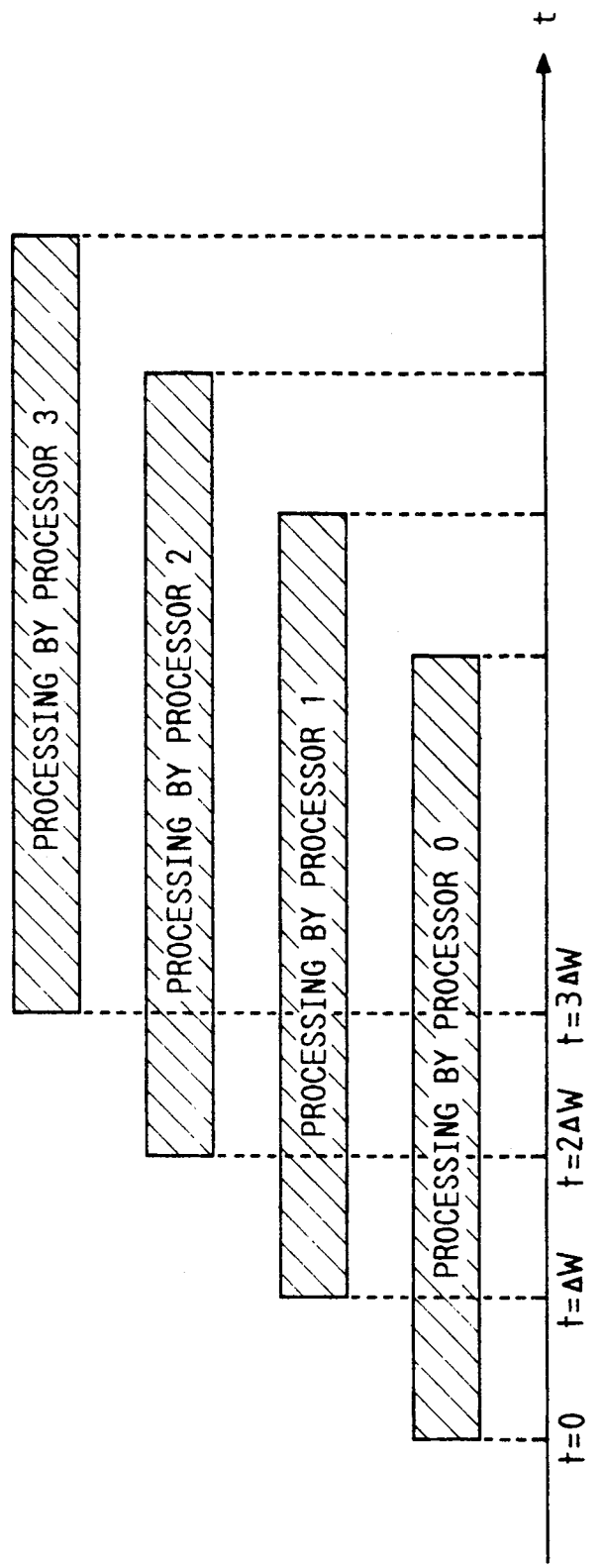

FIG. 16

```
High speed sort ( )
{
int  V[MAX KEY],  SX[MAX DATA],
int  i, sum, k,  j ,
    for ( k = min-key , K<= max-key j k + + ) {
        V[k] = 0 ;
    }
    for ( i = i , i <= N ,i ++ ) {
        k = Data [s[i]], sort key ,V[K] = V[K] + 1 ,
    }   /* CREATION OF FREQUENCY */
            INFORMATION ON EACH SORT KEY
sum = i ,
    for ( j = min key , j <= max key , j ++ ) {
        k = V[j] , V[j] = sum , sum = sum + k ,
    }    /* CREATION OF ACCUMULATOION */
            INFORMATION ON EACH SORT KEY
    for ( i = i , i <= N ,i ++ ) {
        k = Data [s[i]], sort key ,j = V[K] ,
        sx[j] = s[i] ,    V[K] ++ ,
    }  /* CREATION OF */
            RESULTS OF SORT
    for ( i = i , i <= N ,i ++ ) {
        s[i] = sx[i] ,
    }   /* COPYING OF RESULTS */
            OF SORT TO S
}
```

METHOD FOR VLSI LAYOUT PATTERN COMPACTION BY USING DIRECT ACCESS MEMORY

BACKGROUND OF THE INVENTION

1. Field of the Invention

This invention relates generally to a method for layout compaction to be performed in a system for generating a layout pattern (hereunder sometimes referred to simply as a layout) of an integrated circuit (IC) such as a very-large-scale integrated circuit (VLSI) and more particularly to a method for VLSI layout pattern compaction for reducing manufacturing costs of ICs such as VLSIs by obtaining a layout which meets a design rule and minimizes an area occupied by an IC.

2. Description of the Related Art

Recent advances in IC fabrication techniques promote refinement of design rules for determining, for example, a minimum distance between adjacent metal lines. To manufacture chips more inexpensively, there is necessity of effective utilization of a conventional resource of a layout. Moreover, there is also necessity of reducing unnecessary spaces which are generally caused in the process of implementing a layout. Therefore, a technique of an automatic conversion of a conventional design rule previously designed into a new one, as well as a compaction technique by which a layout consistent with a design rule can be obtained and unnecessary spaces are decreased in such a layout, is indispensable.

There has been proposed a typical example of conventional practical compaction techniques which is based on a plane sweep method known in the field of computational geometry. For example, compaction techniques employing an enhanced plane sweep method are disclosed in an article entitled "High-Speed Multi-Function Channel Spacer with Deletion of Vias", Denshi-Joho-Tsushin-Gakkai Ronbun-Shi A, Vol. J72-A No. 2, February 1989, pp. 349-358 and an article entitled "Nutcracker: An Efficient and Intelligent Channel Spacer", Proc. of the 24th Design Automation Conference, June 1989, pp. 298-304.

The plane sweep method has the following advantages:

(1) This method is by sufficiently flexible to be able to easily follow complex design rules because wires, contacts and so on are dealt with by processing graphic information representing them and the compact is effected by performing a simple processing.

(2) This method can easily deal with a bending of a wire.

(3) This method is effective in producing a layout of irregular geometry.

The plane sweep method is a technique by which a horizontal line (hereunder referred to as a scan line) is assumed in a plane and geometrical data representing graphic forms such as a line segment intersecting the scanning line is searched moving the scan line from bottom to top (or from top to bottom) in the plane. Such a plane sweep operation usually consists of two phases, namely, a first and second phases. In the first phase, an arrangement of the geometrical data is effected by arranging top and bottom endpoints in the ascending order of size, and ordinates (i.e., y-coordinates) of the arranged endpoints are held in a list "y-queue". Further, in the second phase, the following operation is repeated. Namely, the ordinates of the endpoints held in the list named "y-queue" are read therefrom one by one. Then the read ordinate is inserted into a work list named "x-table" if the corresponding endpoint is a bottom one. In contrast, the read ordinate is deleted from the list "y-queue" if the corresponding endpoint is a top one. Thereby, the geometrical data representing graphic forms intersecting the scanning line are always held in the work list "x-table". Let n be the number of data (thus, be a positive integer). The operation of the first phase can be performed in time O(nlogn). If balanced binary trees using abscissas (i.e., x-coordinates) as keys are employed as a data structure of the work list "x-table", each of the insertion and deletion operations of the second phase can be done within time bound O(nlogn). Thus the entire plane sweep operation can be accomplished in time O(nlogn). Consequently, time complexity of the plane sweep method is O(nlogn).

Despite the above described advantages, the plane sweep technique is inefficient because of the fact that when the number n of data to be processed increases, a processing time also increases in proportion to nlogn. Moreover, in case of employing the plane sweep method, it is difficult to employ a multiprocessing system using a plurality of processors for processing data at a high speed. The present invention is created to resolve the above stated problems of the conventional compaction technique based on the plane sweep method.

It is accordingly an object of the present invention to provide a method for layout compaction which has the advantages of the plane sweep method and can perform a packing-element-in-bottom-boundary-region or squeeze-down processing and a packing-element-in-top-boundary-region or lift-up processing, which will be described later, at a high speed.

It is another object of the present invention to provide a method for layout compaction in which even if the number n (n is a positive integer) of data increases, an increase in processing time can be restrained to an extent proportional to the number n of data.

It is still another object of the present invention to provide a high-speed method for layout compaction which can perform a multiprocessing at a high speed.

SUMMARY OF THE INVENTION

To achieve the foregoing objects, in accordance with a first aspect of the present invention, there is provided a method for layout compaction which comprises steps of establishing storage areas in a direct access memory as a boundary information memory to which geometrical information on boundaries of a layout is written, searching layout elements of groups adjoining the boundaries of the layout and performing a packing-element-in-bottom-boundary-region processing and a packing-element-in-top-boundary-region processing of the layout elements by using the boundary information memory.

Thus, by establishing storage areas in a direct access memory as a boundary information memory to which geometrical information on boundaries of a layout is written, a search for bending points of the layout elements (namely, dividing points of data representing the layout elements) to be objects of a compaction, as well as retrieval of information on positions of layout elements directly adjoining the boundary which follow a predetermined design rule, can be performed only be reading the information stored at addresses in the boundary information memory corresponding to coordinates of an area (hereunder sometimes referred to as a layout area) in which the layout elements are arranged. Thereby, a packing-element-in-bottom-boundary-region processing and a packing-element-in-top-boundary-region processing of the layout elements can be effected at a high speed.

In accordance with a second aspect of the present invention, there is provided a method for layout compaction which comprises steps of classifying layout elements in terms of coordinates in a direction of height into groups of layout elements a same height, establishing storage areas in a direct access memory as a boundary information memory to which geometrical information on boundaries of a layout is written, performing a packing-element-in-bottom-boundary-region processing of layout elements of each of groups having a same height and adjoining a boundary of a layout area by using the boundary information memory and performing a packing-element-in-top-boundary-region processing of the layout elements of each of the groups, which are employed in the packing-element-in-bottom-boundary-region processing, by using the boundary information memory.

Thus, by preliminarily classifying layout elements of a same height into a group, orders at which the processings of the layout elements are performed are settled. Thereby, a search for data representing objects of a compaction can be made to be unnecessary. Consequently, a packing-element-in-bottom-boundary-region processing and a packing-element-in-top-boundary-region processing of the layout elements can be effected at a further higher speed.

In accordance with a third aspect of the present invention, there is provided a method for layout compaction which comprises steps of classifying layout elements in terms of coordinates in a direction of height into groups of layout elements a same height, establishing storage areas in a direct access memory as a boundary information memory to which geometrical information on boundaries of a layout is written, assigning a processor to each of the groups of layout elements obtained by the classification and performing a packing-element-in-bottom-boundary-region processing and a packing-element-in-top-boundary-region processing of the layout elements of each of the groups independently of one another by providing a delay among the processings effected by the processors and simultaneously using the boundary information memory.

Thus each address of the boundary information memory corresponds to a coordinate (e.g., an x-coordinate) of the boundary and data stored at the addresses of the boundary information memory respectively corresponding to the coordinates of the boundary can be referred to independently of one another. Thereby, a multiprocessing of layout elements using a plurality of processors can be performed.

Consequently, the present invention has a profound practical effect.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which:

FIG. 14(b) is a timing chart for illustrating a compaction processing by each of the processors of FIG. 14(a) from a start to an end thereof;

FIG. 16 is a diagram for illustrating a sort algorithm for performing an index sorting processing of data having a sort key.

DETAILED DESCRIPTION OF THE PREFERRED EMBODIMENTS

Hereinafter, preferred embodiments of the present invention will be described in detail by referring to the accompanying drawings.

Figure 5:
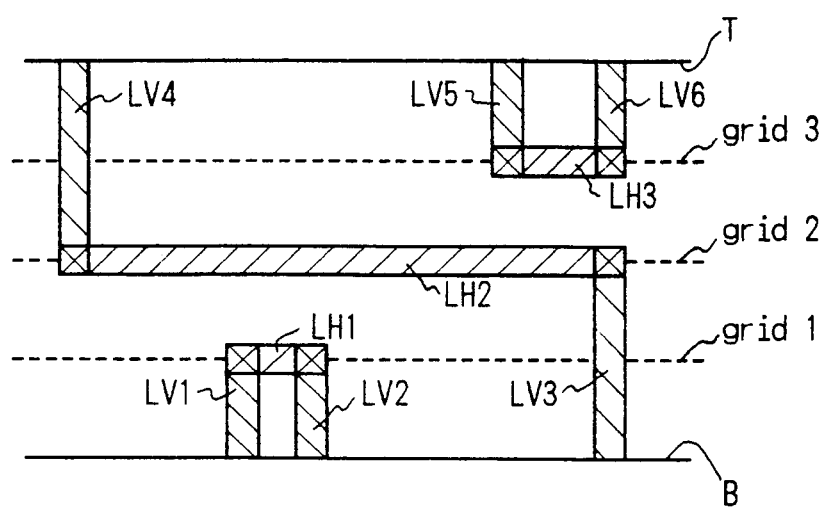
FIG. 5 is a diagram for illustrating a layout to which the present invention is applied.

A first embodiment of the present invention will be described hereinbelow by explaining a case where this embodiment is applied to a layout of FIG. 5. In FIG. 5, reference character B indicates a bottom boundary of the layout; T a top boundary thereof; LH1 to LH3 horizontal wires; LV1 to LV6 vertical wires; and grid1 to grid3 groups of layout elements. Incidentally, a compaction is effected in the y direction (namely, the vertical direction) as viewed in this figure.

Figure 1:
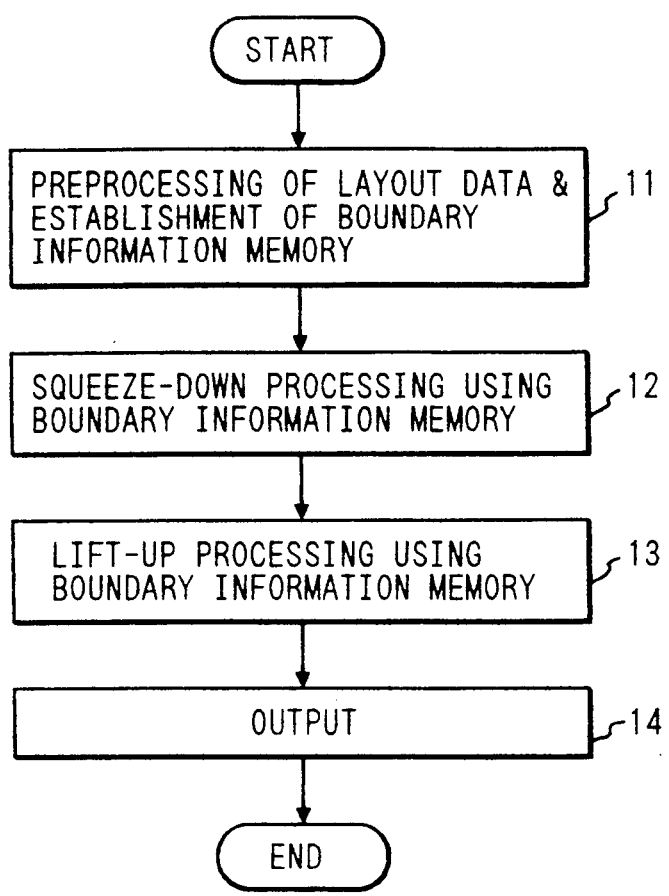
FIG. 1 is a flowchart of a program for performing a method for layout compaction according to a first aspect of the present invention.
Figure 2:
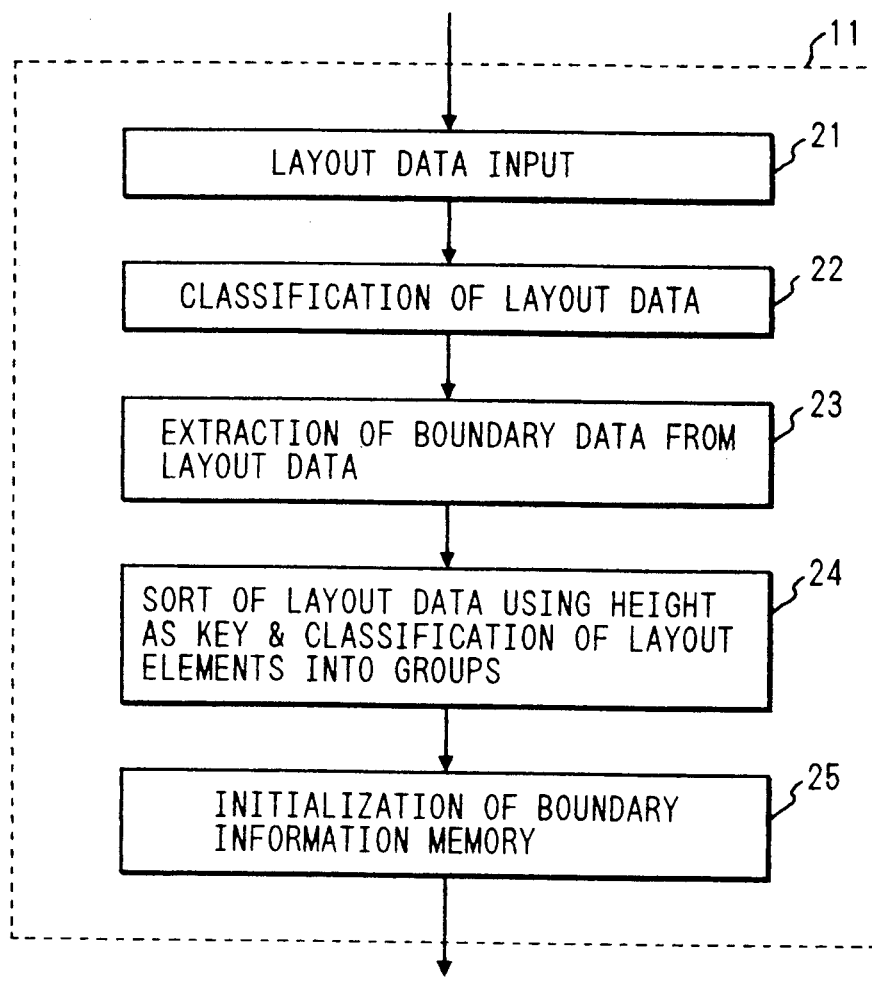
FIG. 2 is a flowchart of a subprogram to be executed for performing a preprocessing of layout data and a boundary information memory setting processing in step 11 of FIG. 1.
Figure 3:
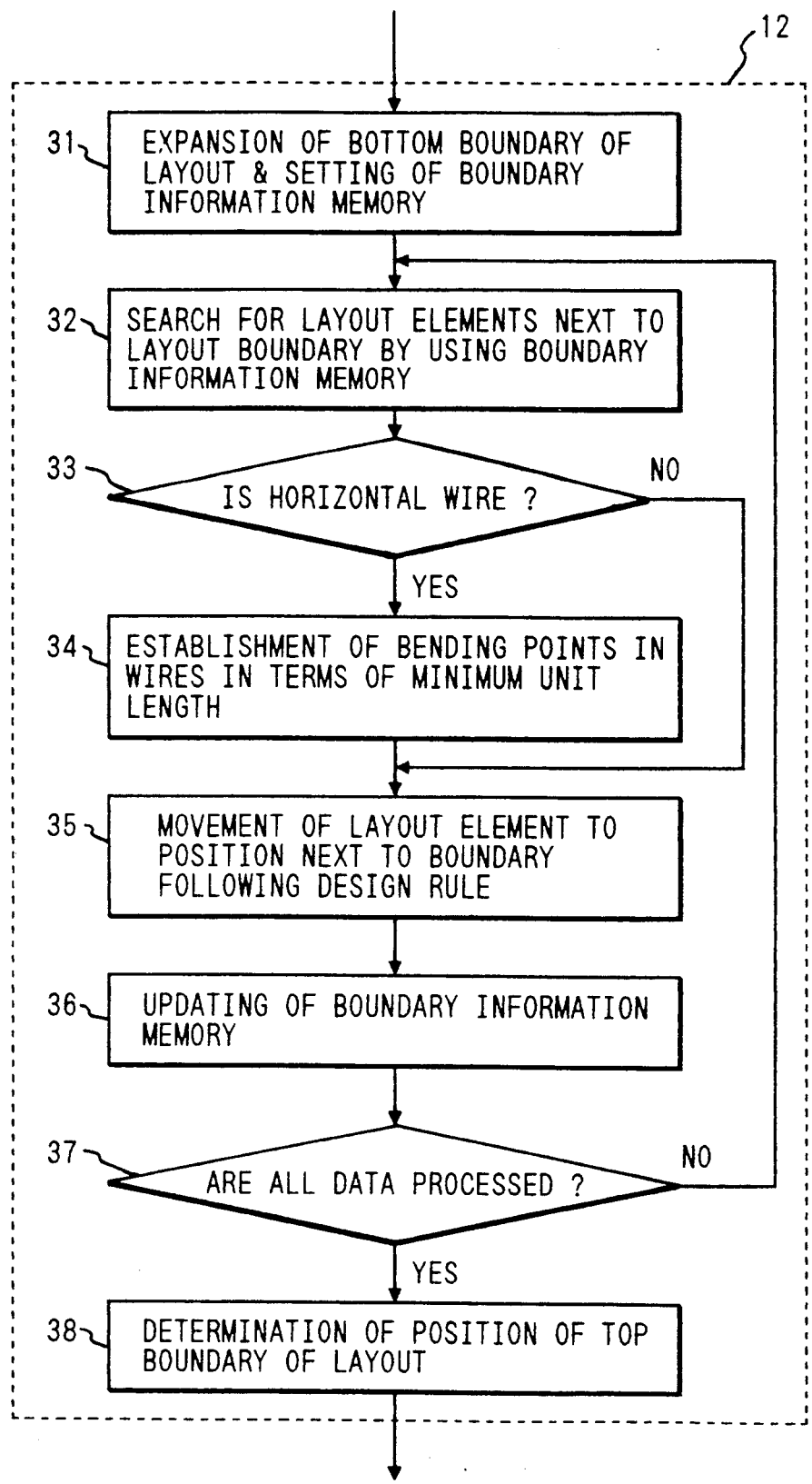
FIG. 3 is a flowchart of another subprogram to be executed for performing a bottom boundary information processing by using the boundary information memory in step 12 of FIG. 1.

FIG. 1 is a flowchart of a program for performing a first embodiment, namely, a first method for layout compaction. First, in step 11, a preprocessing of layout element data is performed. A process of effecting the preprocessing to be performed in step 11 is composed of steps 21 to 25 as illustrated in FIG. 2 which is a flowchart of a subprogram to be executed for performing the preprocessing in step 11 of FIG. 1. In step 21, layout element data indicating layout elements (i.e., layout objects) LH1 to LH3 and LV1 to LV6, layout area data representing a layout area, in which the layout elements are arranged, and data relating to a design rule are inputted as layout data. Regarding the data relating to the design rule, a wire width is 1 in terms of a minimum unit length (to be defined as a minimum length to which a layout element can be divided), and each of a distance between layout elements to be established for following the design rule therebetween, another distance between a layout element and the bottom boundary B of the layout to be established for following the design rule therebetween and still another distance between a layout element and the top boundary T of the layout to be established for following the design rule therebetween is 2 in terms of the minimum unit length, except that the distance between the elements LV1 and LV2 to be established for following the design rule therebetween is 1 in terms of the minimum unit length.

Next, in step 22, the layout elements are classified into horizontal wires, vertical wires and contacts and rectangles (i.e., channels).

Subsequently, in step 23, the subprogram sets the top boundary T and the bottom boundary B, based on the form of the layout area. Namely, data representing the top boundary T and the bottom boundary B are extracted from the layout data.

Then, in step 24, the layout elements having the same height other than the vertical wires are sorted into groups using vertical coordinates (i.e., heights) as keys. In this case, the layout elements other than the vertical wires are sorted into groups grid1 to grid3.

Figure 6A:
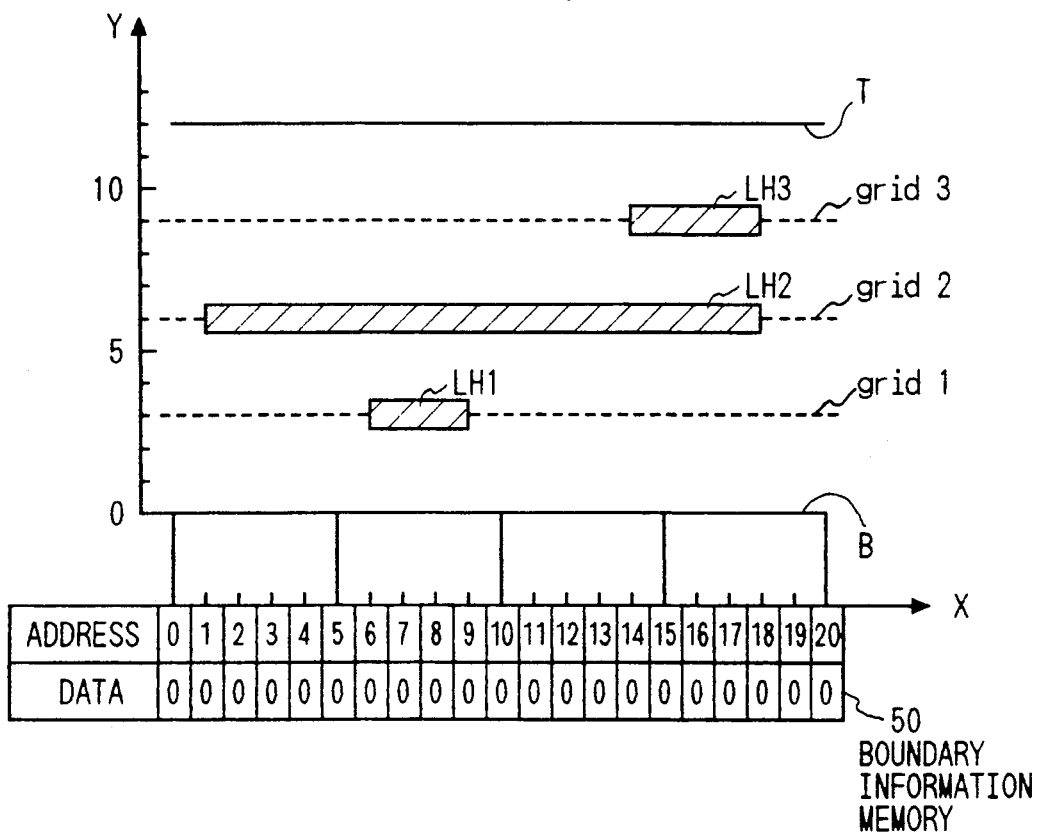
FIGS. 6(a) to 6(i) are diagrams illustrating how layout elements and the contents of a boundary memory change in a packing-element-in-bottom-boundary-region processing using a boundary information memory.

Finally, in step 25, a storage area (hereunder referred to as a boundary information memory) 50 corresponding to a minimum unit of the layout area is established for the purpose of referring to geometrical information on an area of which the compaction is accomplished as illustrated in FIG. 6(a). The area of which the compaction is accomplished is the bottom boundary B expanded by a processing (hereunder referred to as a packing-element-in-bottom-boundary-region processing) which is effected by using the boundary information memory 50 and will be described later. Hereinafter, a boundary of an area R1 to be expanded by performing the packing-element-in-bottom-boundary-region processing will be referred to simply as a boundary RB1. The boundary information memory 50 is established correspondingly to each wiring layer. Abscissas (i.e., x-coordinates) of positions in the layout area correspond to addresses assigned to locations in the boundary information memory 50. Ordinates (i.e., y-coordinates) corresponding to the abscissas are correspondent to data stored in the boundary information memory 50. A minimum unit distance (or a minimum unit length) between data stored in the boundary information memory 50 is set in such a manner to be able to correspond to a minimum unit width to be defined as a minimum width to which a layout element can be divided (or the minimum unit length to be defined as a minimum width to which a layout element can be divided). For instance, in case where the length and the width of each layout element is equal to or more than 1 micron ($\mu$m) and the minimum unit width and the minimum unit length are 0.1 $\mu$m, the minimum unit distance 1 between data stored in the boundary information memory is set to be 0.1 $\mu$m.

In step 12 of FIG. 1, the packing-element-in-bottom-boundary-region processing using the boundary information memory is performed on each of the groups of the layout elements. FIG. 6(a) shows the layout elements LH1 to LH3 and the boundary information memory 50 which is initialized at step 25, based on the form of the bottom boundary B. FIGS. 6(b) to 6(i) are diagrams for illustrating change of the layout elements LH1 to LH3, of the boundary RB1 of the area R1 obtained by updating the bottom boundary B and of the contents of the boundary information memory 50 in the packing-element-in-bottom-boundary-region processing using the boundary information memory 50. A subprogram for effecting the processing of step 12 is composed of steps 31 to 38.

Figure 6B:
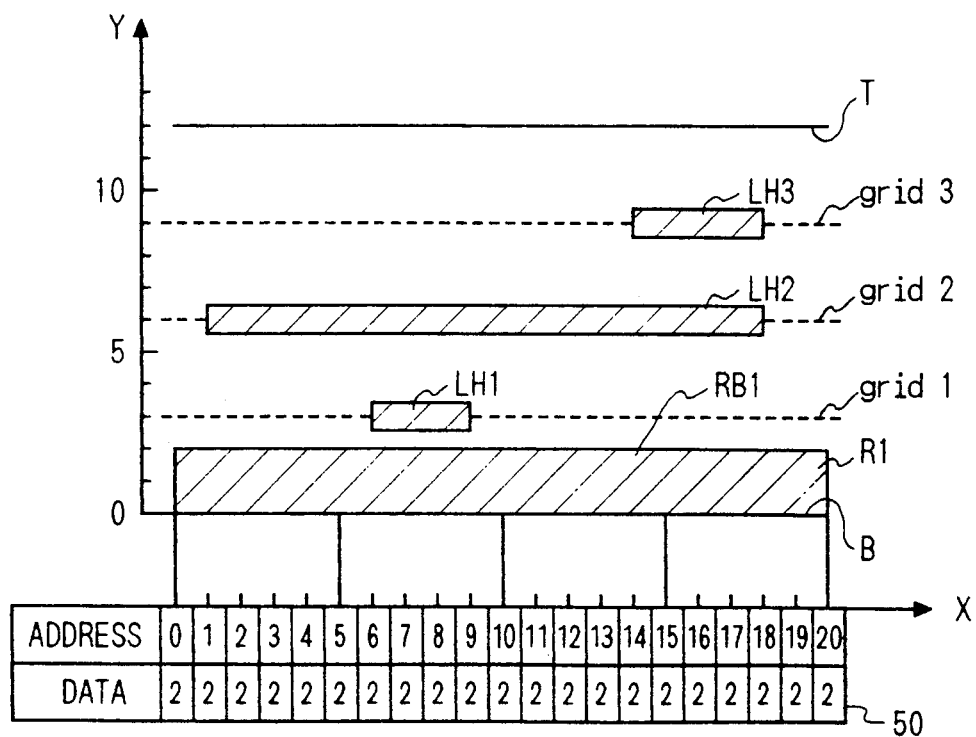

In step 31, the bottom boundary B is upwardly expanded as viewed in FIG. 6(b) by a distance sufficient to follow the design rule because the bottom boundary B is not uneven in this case (if the bottom boundary B is uneven, the boundary B is expanded not only upwardly but also leftwardly and rightwardly according to concaves and convexes), and thereby the boundary RB1 is initially established. Reference character R1 represents an area obtained by expanding the bottom boundary B. Further, geometrical information on the boundary RB1 of the area R1 is stored in the boundary information memory 50. Namely, y-coordinates corresponding to x-coordinates are stored in the boundary information memory 50. According to the design rule in this case, the minimum unit distance is 2, all of the y-coordinates of the boundary RB1 corresponding to the x-coordinates of from 0 to 20 are 2 as shown in this figure. Thus, all of data to be stored at addresses of from 0 to 20 in the boundary information memory 50 are 2.

Figure 6C:
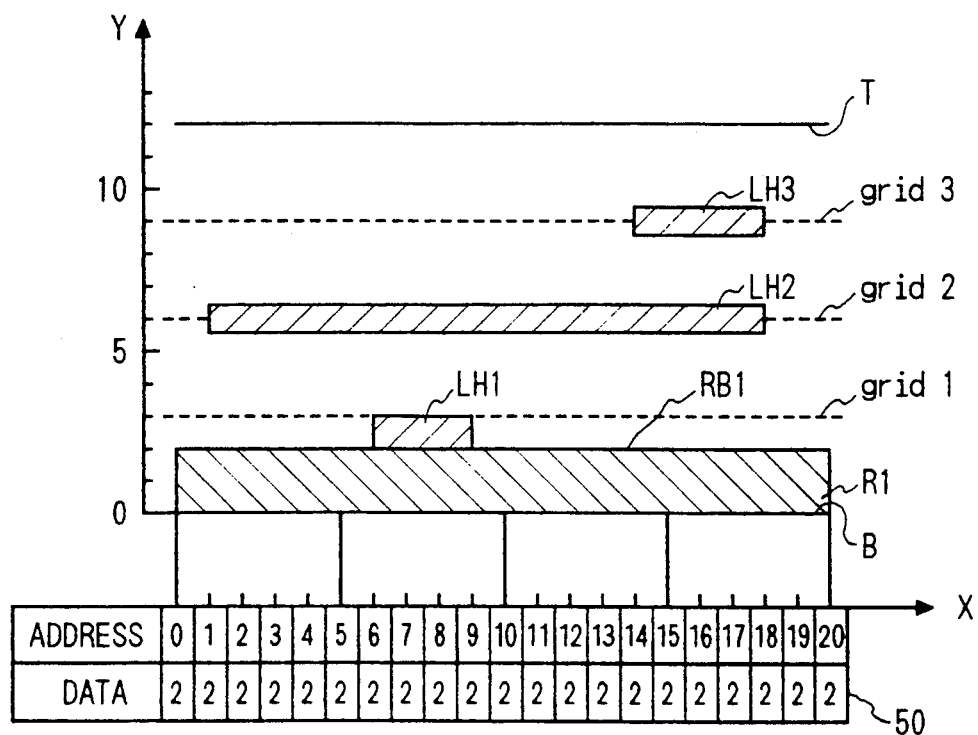

Next, the subprogram advances to step 32 whereupon the layout element LH1 of the group corresponding to a grid line grid1 contiguous to the boundary RB1 is searched for and geometrical information on the form of the boundary RB1 is obtained within the range of the x-coordinate of from the left end to the right end of the element LH1, and geometrical information stored in the boundary information memory 50 corresponding to the range of the x-coordinate of from the left end to the right end of the element LH1 (namely, the information stored at addresses 6 to 9 in the memory 50 in this case) is retrieved. As shown in FIG. 6(b), the boundary RB1 is not uneven within the range of the x-coordinate of from the left end to the right end of the element LH1 (namely, the information stored at each of addresses 6 to 9 is 2 and does not change within this range). Therefore, no candidate (hereunder referred to as a bending-point candidate) for a bending point (or a corner point) is established. Subsequently, in step 33, it is judged whether or not the element LH1 is a horizontal wire. In this case, the element LH1 is a horizontal wire. Next, in step 34, bending points are usually established from bending-point candidates set in step 32. However, in this case, there are no bending-point candidates, so that no bending point is established. Then, as illustrated in FIG. 6(c), the subprogram advances to step 35 whereupon the element LH1 is moved to an adjoining point next to the boundary RB1, namely, to a position which follows the design rule and is next to but does never overlap with the boundary RB1 according to the geometrical information made in step 32 to be held in the boundary information memory 50.

Figure 6D:
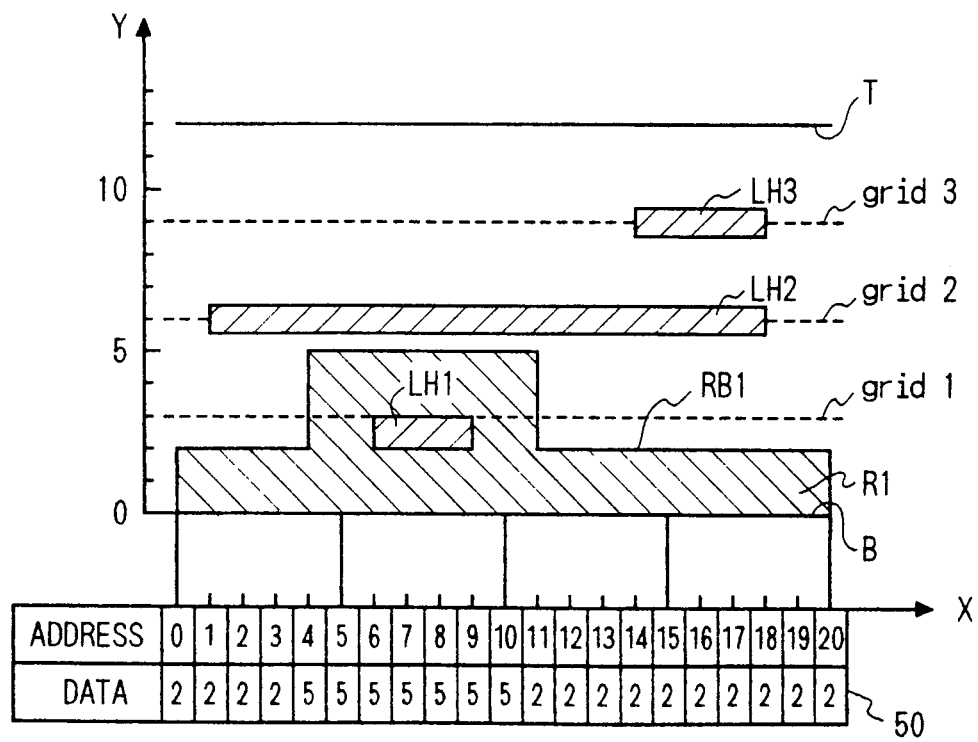

Next, in step 36, the boundary RB1 is expanded in the upward, leftward and rightward directions of the element LH1 as viewed in FIG. 6(d) and then the contents of the boundary information memory 50 corresponding to the expanded boundary RB1 are updated. However, at that time, the contents of the memory 50 corresponding to the x-coordinate of 11 is not changed into 5. This is because the expansion of the boundary RB1 is effected within the following interval of the x-coordinate: $4 \leq x < 11$. Namely, in response to the updating of the boundary RB1, the information stored in the boundary information memory 50 is updated within the interval of the x-coordinate: $x_s \leq x < x_e$ where $x_s$ and $x_e$ denote the x-coordinate of a starting point of the boundary RB1 and that of an end point thereof, respectively. Then, it is judged in step 37 whether or not the processing which should be effected in steps 32 to 36 has been performed on all of the groups of the layout elements. In this case, there still remain the groups of the layout elements to be processed. Thus the processing of a loop consisting of steps 32 to 37 is repeatedly performed.

Namely, in step 32, the layout element LH2 of the group corresponding to a grid line grid2 contiguous to the boundary RB1 of FIG. 6(d) is searched for and geometrical information on the form of the boundary RB1 is obtained within the range of the x-coordinate of from the left end to the right end of the element LH2, and geometrical information stored in the memory 50 corresponding to the range of the x-coordinate of from the left end to the right end of the element LH2 (namely, the information stored at addresses 1 to 18 in the memory 50 in this case) is retrieved. There is found unevenness of the boundary RB1 in such a range of the x-coordinate (namely, the stored information changes at addresses 4 and 11 in the memory 50), bending-point candidates are established on the boundary RB1 according to the unevenness.

Figure 6E:
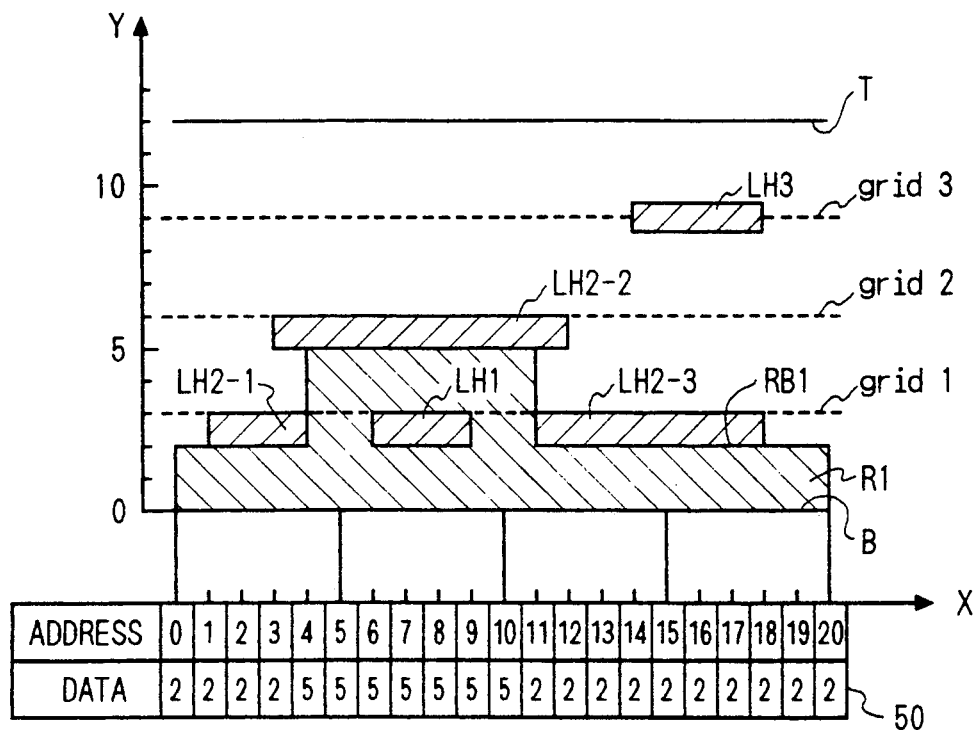

Then, it is judged in step 33 whether or not the element LH2 is a horizontal wire. As is shown in FIG. 6(d), the element LH2 is a horizontal wire. Thus, in the element LH2, bending points are established from the bending-point candidates obtained in step 32 and the element LH2 is divided at the established bending points as illustrated in FIG. 6(e) into layout elements LH2-1, LH2-2 and LH2-3. At that time, the element LH 2-2 need have margins at both ends thereof to respectively be connected to the elements LH2-1 and LH2-3 by vertical wires. Therefore, in this case, the element LH2-2 is expanded from both ends (i.e., the bending points) thereof by a wire width in the horizontal direction as shown in FIG. 6(e). Subsequently, these elements LH2-1, LH2-2 and LH2-3 are moved to positions at which these elements are in contact with the boundary RB1 in step 35 according to the geometrical information retrieved in step 32, as illustrated in FIG. 6(e).

Figure 6F:
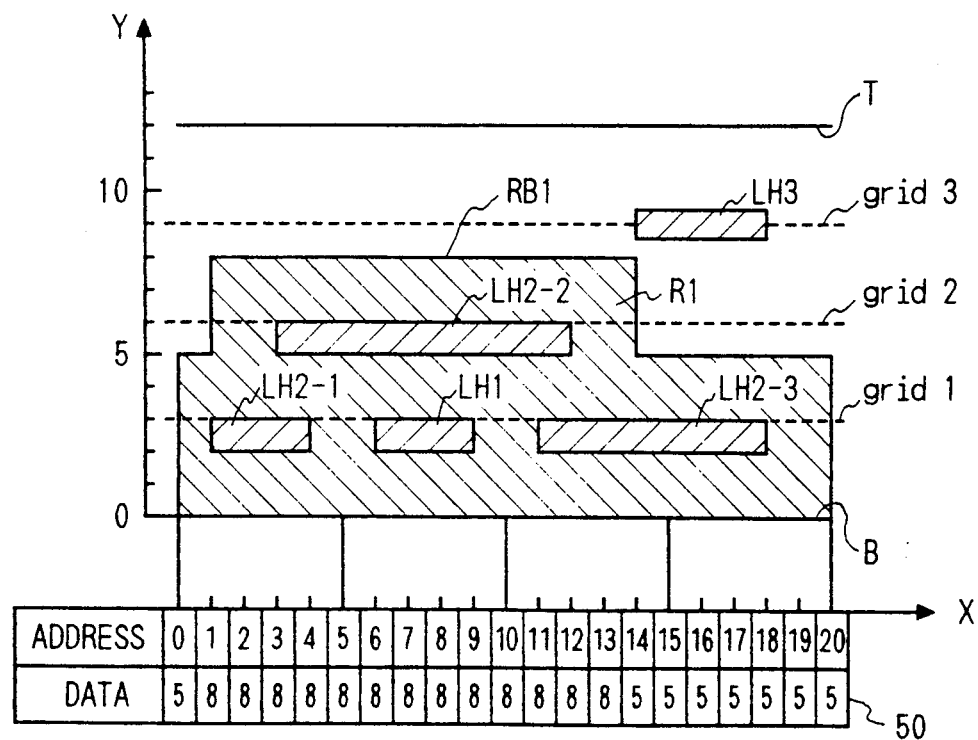
Figure 6G:
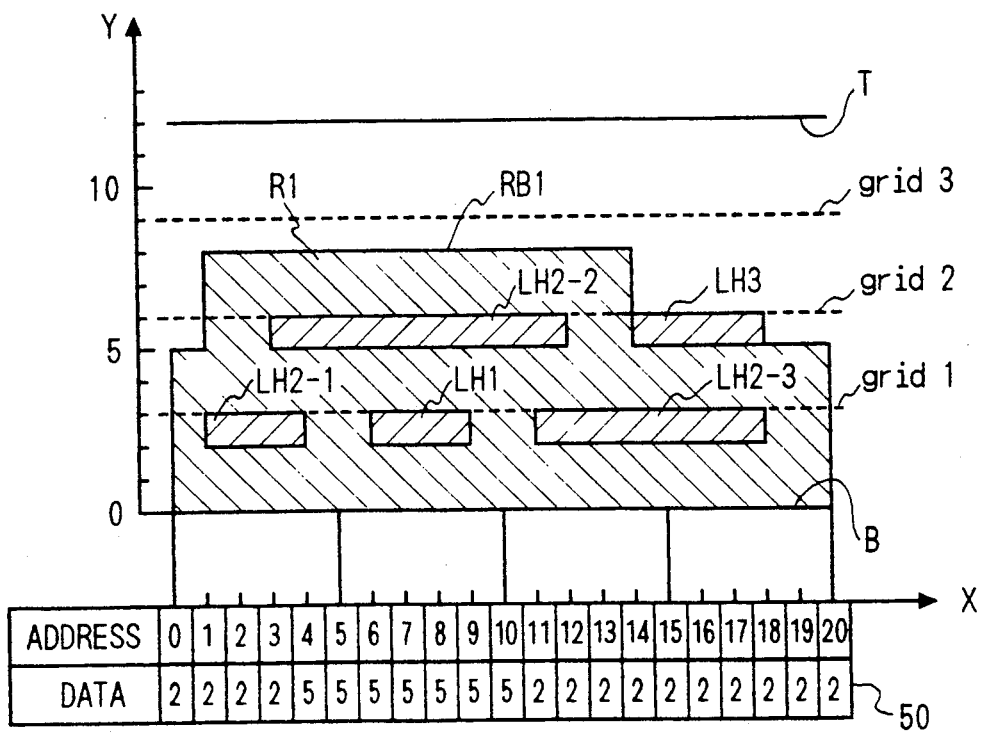

Next, in step 36, the boundary RB1 is expanded in the upward, leftward and rightward directions of the elements LH2-1, LH2-2 and LH2-3 are expanded, and then the information stored in the boundary information memory 50 corresponding to the boundary RB1 of the expanded area R1 is updated. Subsequently, it is judged in step 37 again whether or not the processing which should be effected in steps 32 to 36 has been performed on all of the groups of the layout elements. In this case, there is a group of layout elements on a grid line grid3. Thus the processing of a loop consisting of steps 32 to 37 is repeated once again as illustrated in FIGS. 6(f) to 6(h).

Figure 6H:
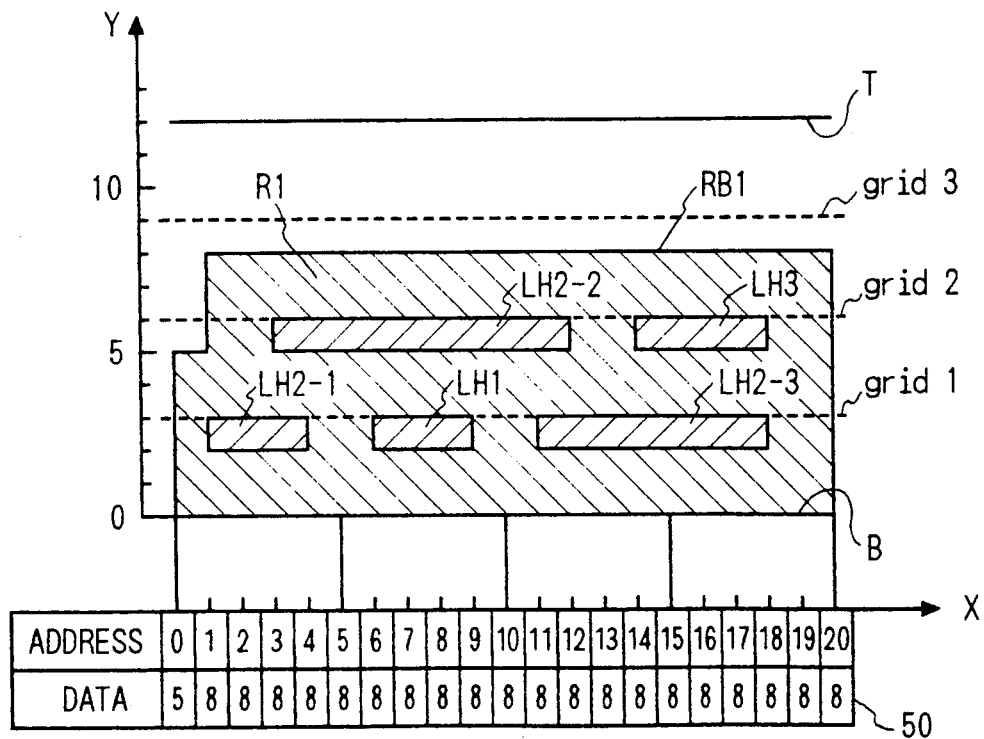
Figure 6I:
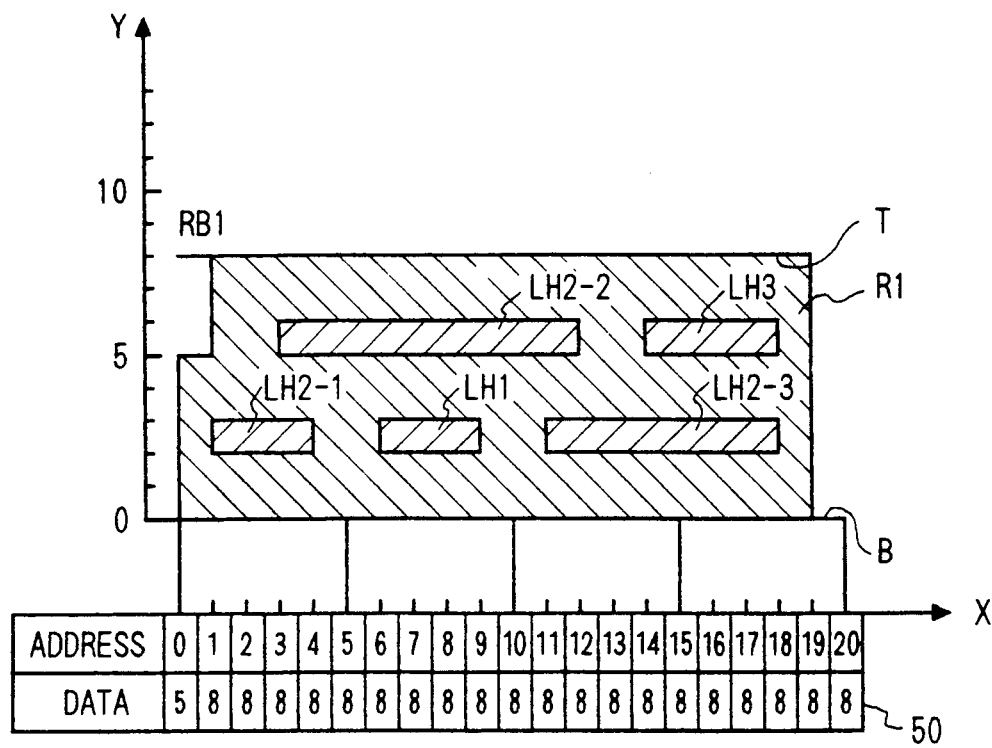
Figure 7:
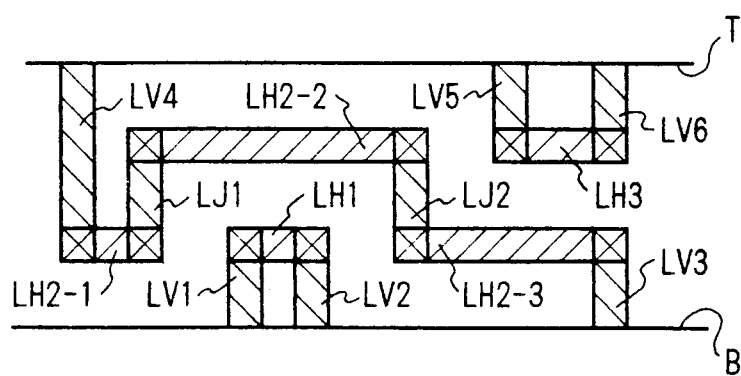
FIG. 7 is a diagram for illustrating a resultant layout obtained by the packing-element-in-bottom-boundary-region processing using the boundary information memory.

If the processing which should be effected in steps 32 to 36 has been performed on all of the groups of the layout elements, the contents of the boundary information memory 50 of FIG. 6(h) is referred to and the y-coordinate (i.e., the height) of the top boundary T is determined as illustrated in FIG. 6(i) in step 38. FIG. 7 shows the resultant layout obtained as a result of the processing effected in step 12. In this figure, reference characters LJ1 and LJ2 designate vertical wires generated by the "bending" of the layout element LH2 as above described. However, there is a useless bend of a wire such as a vertical wire LJ1 in the resultant layout obtained in step 12. Thus, a modification of the layout is effected in step 13 of FIG. 1 by removing the useless bend therefrom.

Figure 4:
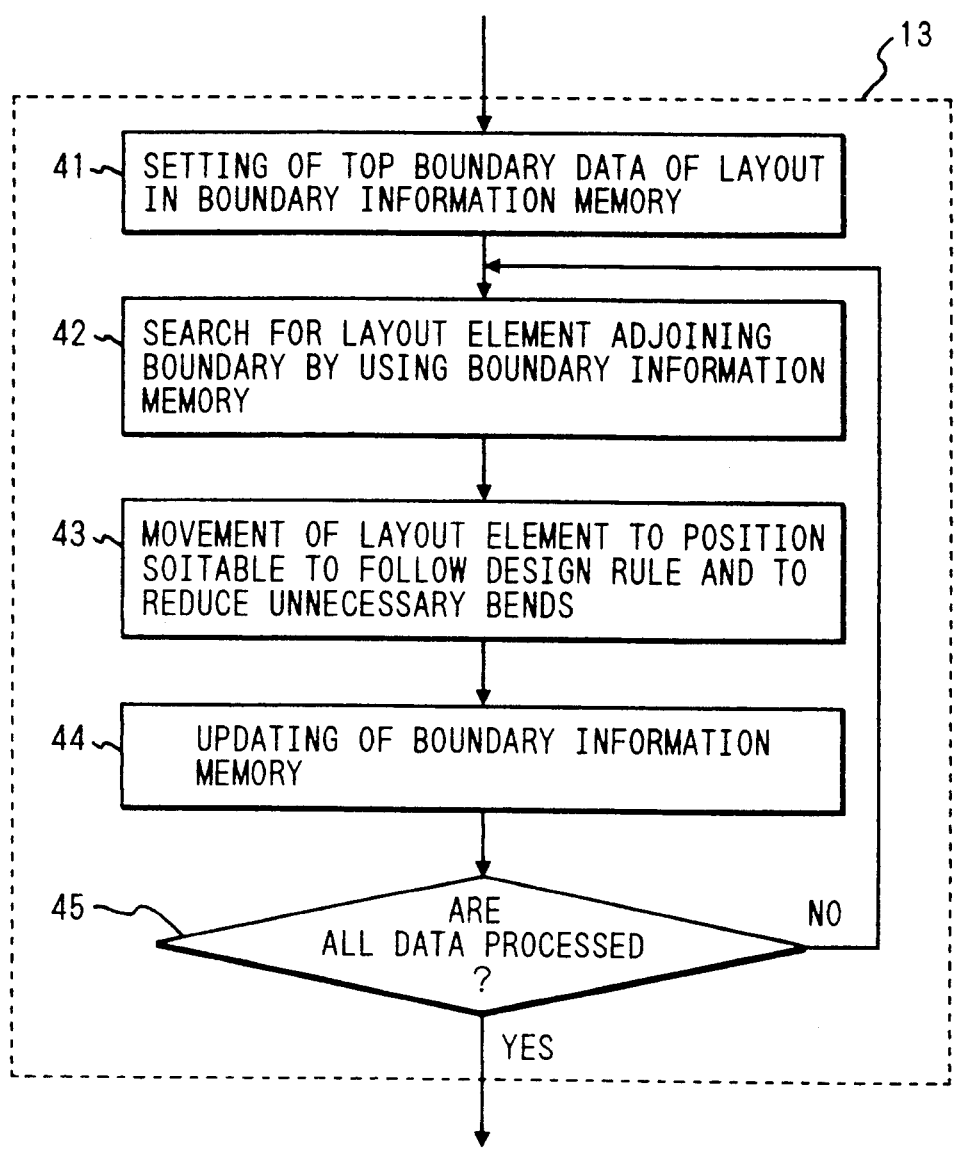
FIG. 4 is a flowchart of a subprogram for performing the processing to be effected in step 13 of FIG. 1.
Figure 8A:
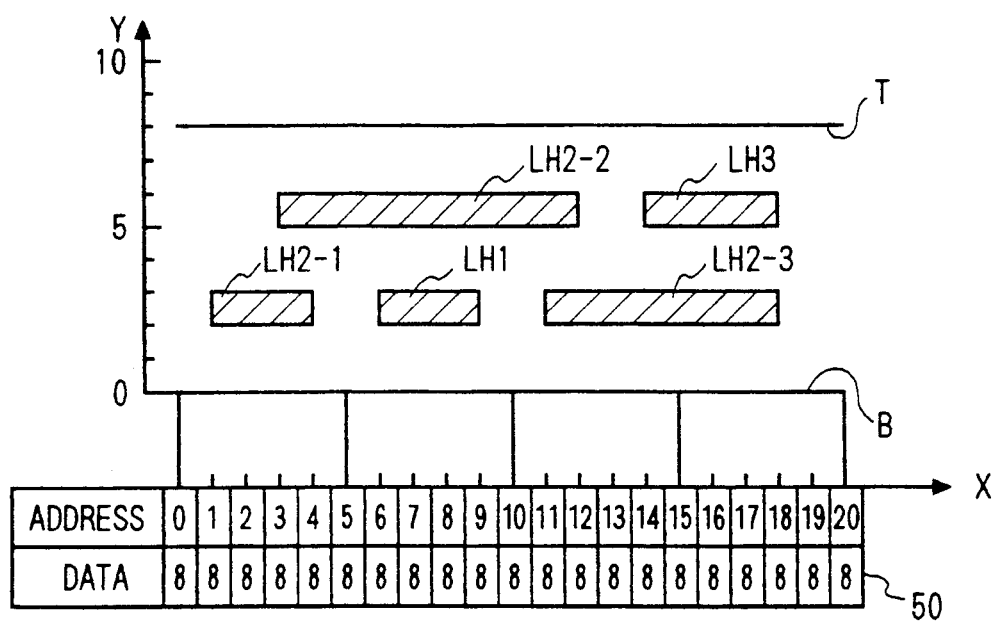
FIGS. 8(a) to 8(f) are diagrams illustrating how layout elements and the contents of a boundary memory change in a packing-element-in-top-boundary-region processing using a boundary information memory.
Figure 8B:
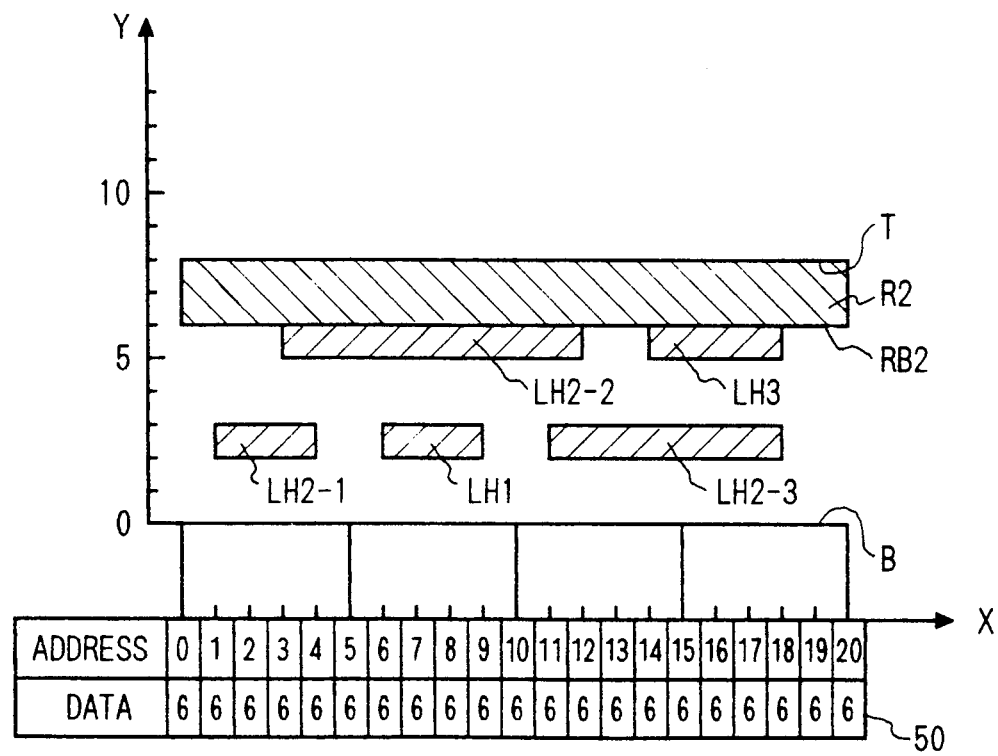
Figure 8C:
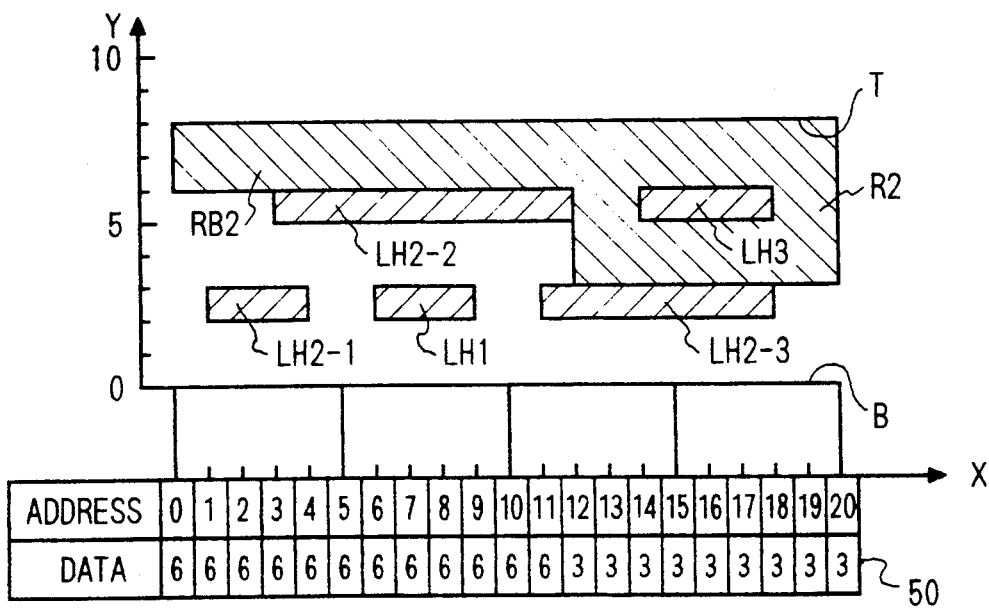
Figure 8D:
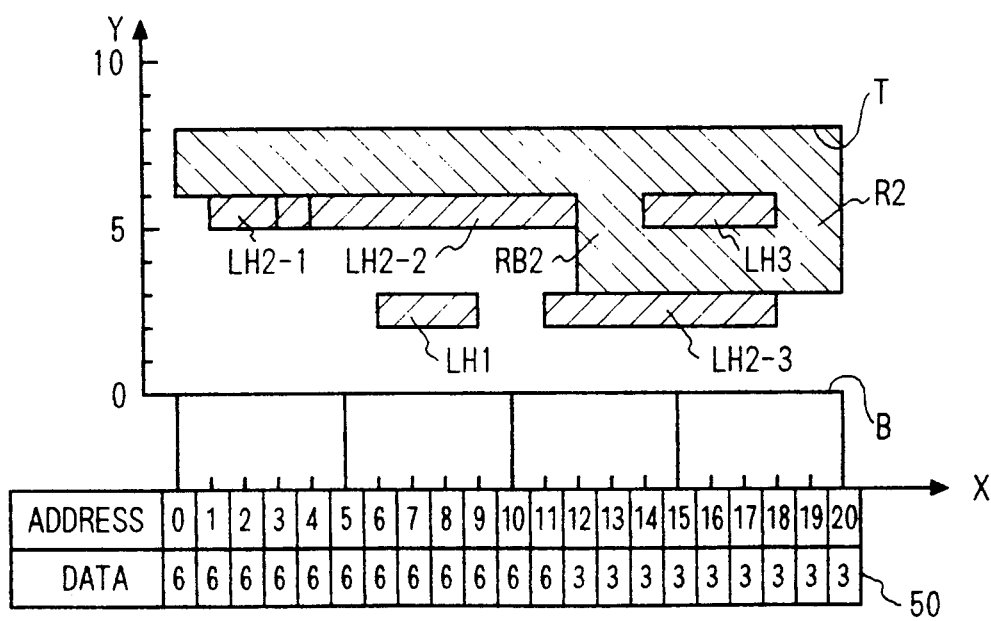
Figure 8E:
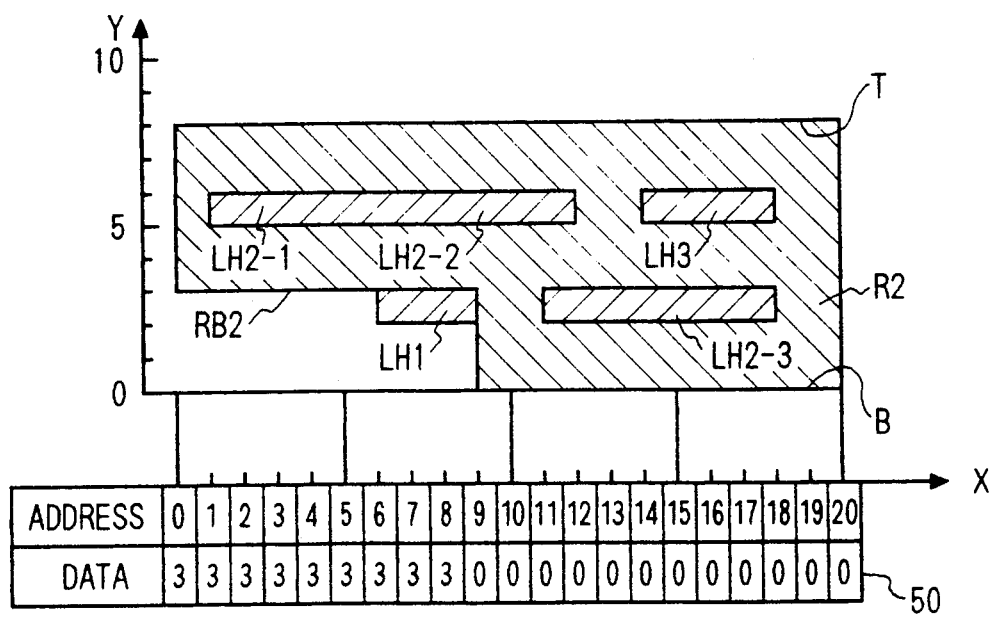
Figure 8F:
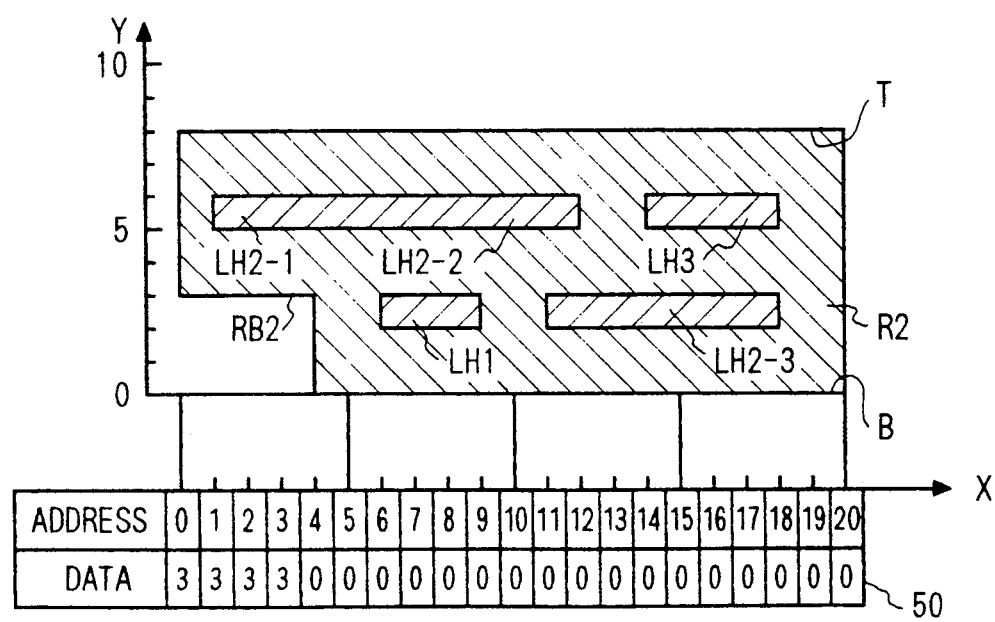
Figure 9:
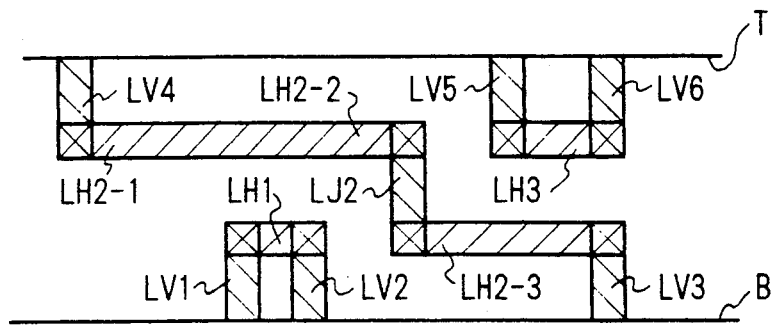
FIG. 9 is a diagram for illustrating a final resultant layout obtained by the packing-element-in-top-boundary-region processing using the boundary information memory.

FIG. 4 is a flowchart of a subprogram for performing the processing to be effected in step 13 of FIG. 1. As shown in this figure, this subprogram consists of steps 41 to 45. FIG. 8 is a diagram for showing horizontal wires LH1, LH2-1, LH2-2, LH2-3 and LH3, which are objects of the processing (hereunder referred to as the packing-element-in-top-boundary-region processing) to be effected in step 13, and the initialized boundary information memory 50. FIGS. 8(b) to 8(f) are diagrams for illustrating changes of the horizontal wires LH1, LH2-1, LH2-2, LH2-3 and LH3, the boundary RB2 and the boundary information memory 50 while effecting the packing-element-in-top-boundary-region processing by using the boundary information memory. In step 41, the top boundary T is downwardly expanded as viewed in FIG. 8(b) by a distance enough to follow the design rule because the top boundary T is not uneven in this case (if the bottom boundary B is uneven, the boundary T is expanded not only downwardly but also leftwardly and rightwardly according to concaves and convexes). Reference character R2 represents an area obtained by expanding the top boundary T. Hereunder, the boundary of the area R2 is referred to as the boundary RB2 for simplicity of description. Similarly z as in case of step 31, geometrical information on the boundary RB2 of the area R2 is stored in the boundary information memory 50. Next, in step 42, geometrical information stored in the boundary information memory 50 corresponding to the range of the x-coordinate of from the left end to the right end of the element LH3 is retrieved. Then, in step 43, the element LH3 is usually moved to a position at which useless bends are reduced. However, in this case, there are no bends in the element LH3. Moreover, the element LH3 is in contact with the boundary RB2. Therefore, the element LH3 is not moved actually. Next, in step 44, the top boundary T is expanded in the downward, leftward and rightward directions of the element LH3 by a distance sufficient to follow the design rule and then the contents of the boundary information memory 50 corresponding to the boundary RB2 of the area R2 are updated. Subsequently, it is judged in step 45 whether or not the processing has been performed on all of the groups of the layout elements. In this case, there still remain the layout elements of the groups corresponding to the grid lines grid1 and grid2. Thus the processing of a loop consisting of steps 42 to 45 is repeatedly performed. In step 42, the geometrical information stored in the boundary information memory 50 corresponding to the range of the x-coordinate of from the left end to the right end of each of the elements LH2-1, LH2-2 and LH2-3 is retrieved. Then, in step 43, the elements LH2-1, LH2-2 and LH2-3 are moved to positions suitable for reducing useless bends according to the geometrical information stored in the boundary information memory 50. At that time, the element LH2-2 is in contact with the boundary RB2 and has the largest y-coordinate (i.e., height) among the elements LH2-1 to LH2-3. Thus the y-coordinate of the element LH2-2 is employed as a reference position (hereunder referred to as a packing-element-in-top-boundary-region-processing reference position) used for performing the packing-element-in-top-boundary-region processing. The elements LH2-1 and LH-3 which have y-coordinates smaller than the y-coordinate of the packing-element-in-top-boundary-region-processing reference position are moved to the packing-element-in-top-boundary-region-processing reference position as close as possible. In this case, the element LH2-1 can move to the packing-element-in-top-boundary-region-processing reference position, while the element LH2-3 cannot move thereto because it touches the boundary RB2. The positions of the elements LH2-1, LH2-2 and LH2-3 upon completion of the processing in step 43 are shown in FIG. 8(d). In step 44, the boundary RB2 is expanded as illustrated in FIG. 8(e). Then, it is judged in step 45 whether or not the processing has been performed on all of the groups of the layout elements. In this case, there remain the layout elements of the group corresponding to the grid line grid1. Thus the processing to be effected in steps 42 to 45 is performed on the elements of this group. Consequently, a resultant layout illustrated in FIG. 9 is obtained.

Figure 10:
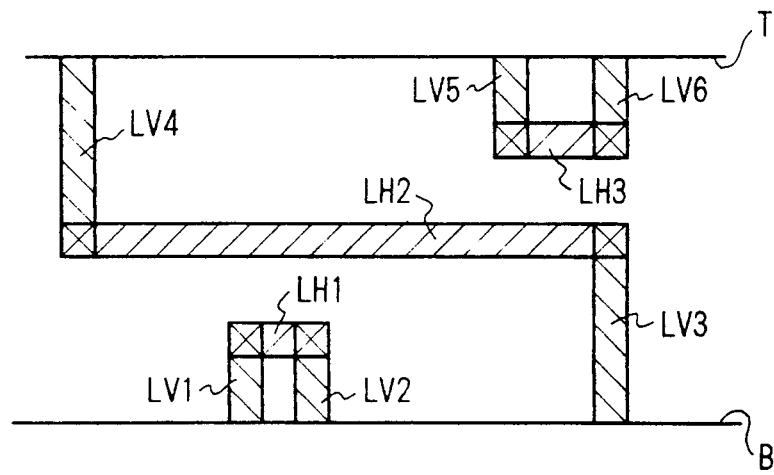
FIG. 10 is a diagram for illustrating another resultant layout in case of taking no account of a bending of a wire.

Further, another resultant layout in case of taking no account of a bending of a wire is shown in FIG. 10. It is understood by a comparison between the resultant layouts of FIGS. 9 and 10 that the height of a rectangular area including the resultant layout (hereunder referred to simply as the layout area) of FIG. 9 is nearly two-thirds of that of the layout area of FIG. 10 and that the bending of a wire is sufficiently effective.

In case of the first embodiment of the present invention, by comprising a step of establishing storage areas in a direct access storage as the boundary information memory 50 in which geometrical information on the boundaries RB1 and RB2, it has only to read information stored at addresses in the boundary information memory corresponding to x-coordinates of positions in a layout area when data on objects of layout compaction is retrieved. Thus the squeeze-down and lift-up processings can be performed at a high speed. Incidentally, time complexity in case of the first embodiment will be described hereinbelow. First, the relation among the number N of data on objects of the layout compaction, a layout-area width W and the number T of the groups of the layout elements is given by:

$$N \alpha TW \qquad (1)$$

Further, the range (i.e., the size) K of the boundary information memory is determined by:

$$K = W/u \qquad (2)$$

where u denotes a minimum unit size. Thus complexity C of time required for writing data to the boundary information memory is defined by:

$$C = T \cdot K$$

The right-hand side of this equation can be rewritten by using the equation (2) as follows:

$$\begin{aligned} C &= T \cdot W/u \\ &= C_o \cdot N \end{aligned} \qquad (3)$$

where $C_o$ represents a proportional constant including the term u. Consequently, the time complexity C is O(N). Moreover, if a "coefficient-information alignment method" disclosed in Japanese Patent Application No. 1-67011, which will be described later, is employed as a sorting technique, the time complexity of the entire first embodiment is O(N). This is because time complexity of a processing of vertical wires made to be O(N) by searching the layout area from left to right (or from right to left) for horizontal wires and contacts in case of employing this method.

In case of this sorting technique, global information on all data to be sorted is preliminarily obtained as frequency information V. Thereafter, based on the frequency information V, accumulation information indicating an ascending order of the frequency of data corresponding to a sort key is generated. In view of such a meaning of the accumulation information, the sort is completed only by outputting the data. Referring to FIG. 16, there is shown a sort algorithm, of which the time complexity is O(N), for performing an index sorting processing of data having a sort key. In FIG. 16, s[i] denotes an index indicating an order in which data is read, namely, indicating an order of data which includes i-th information; "min key" a minimum value of the sort key; and "max key" a maximum value of the sort key. In case of this algorithm, even after the sort processing is finished, information having the same sort key preserves an order which the information has before the sort processing is started. Therefore, data having more than one kind sort keys (for instance, x and y coordinates) can be read only by repeatedly performing this sort algorithm by serially using the sort keys in an ascending order of priority. Thus the sort is completed by repeating the performing of this algorithm 3(N+Κ) to 4(N+Κ) times at the most. Here, Κ designates a range of a value corresponding to a coordinate or the like.

As described above, the first embodiment of the present invention comprises steps of establishing storage areas as the boundary information memory 50, classifying layout elements in terms of coordinates in a direction of height into groups, performing a packing-element-in-bottom-boundary-region processing of layout elements of each of groups having a same height and adjoining a boundary of a layout area by using the boundary information memory 50 and performing a packing-element-in-top-boundary-region processing of the layout elements of each of the groups, which are employed in the packing-element-in-bottom-boundaryregion processing, by using the boundary information memory 50. Thereby, a resultant minimum layout can be obtained at a considerably high speed. Thus the present invention has profound practical effects. Further, in case where the layout has a plurality of layers (hereunder sometimes referred to as layout layers), a boundary information memory can be established correspondingly to each layer. Therefore, the present invention can be easily applied to a compaction of a layout having a plurality of layout layers.

Incidentally, in the foregoing description, the first embodiment in case of applying the present invention especially to horizontal wires has been described in detail by way of example. It goes without saying that the present invention is generally effective in compaction, which is effected for the purpose of following a design rule and minimize a layout area, of a layout of a functional circuit block or the like.

Hereinafter, a second embodiment of the present invention will be described in detail with reference to FIGS. 11 to 15. Incidentally, a layout to which a method according to the second embodiment of the present invention is the same as of FIG. 5 and a design rule employed in this embodiment is the same as employed in case of the first embodiment.

Figure 11:
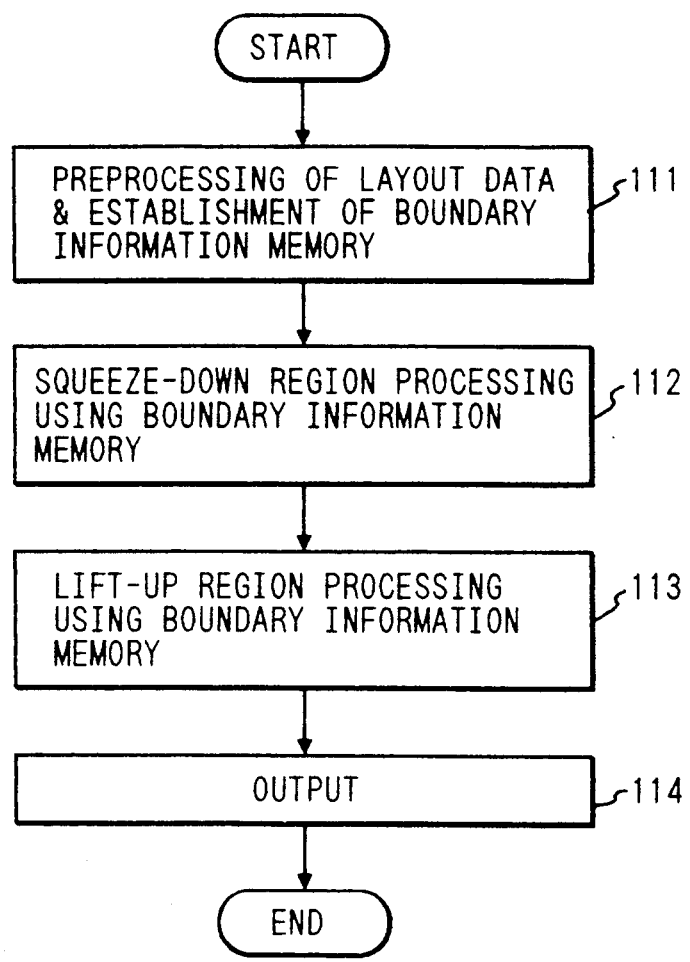
FIG. 11 is a flowchart of a program for performing a second embodiment of the present invention (namely, a second method for layout compaction according to the present invention)
Figure 12:
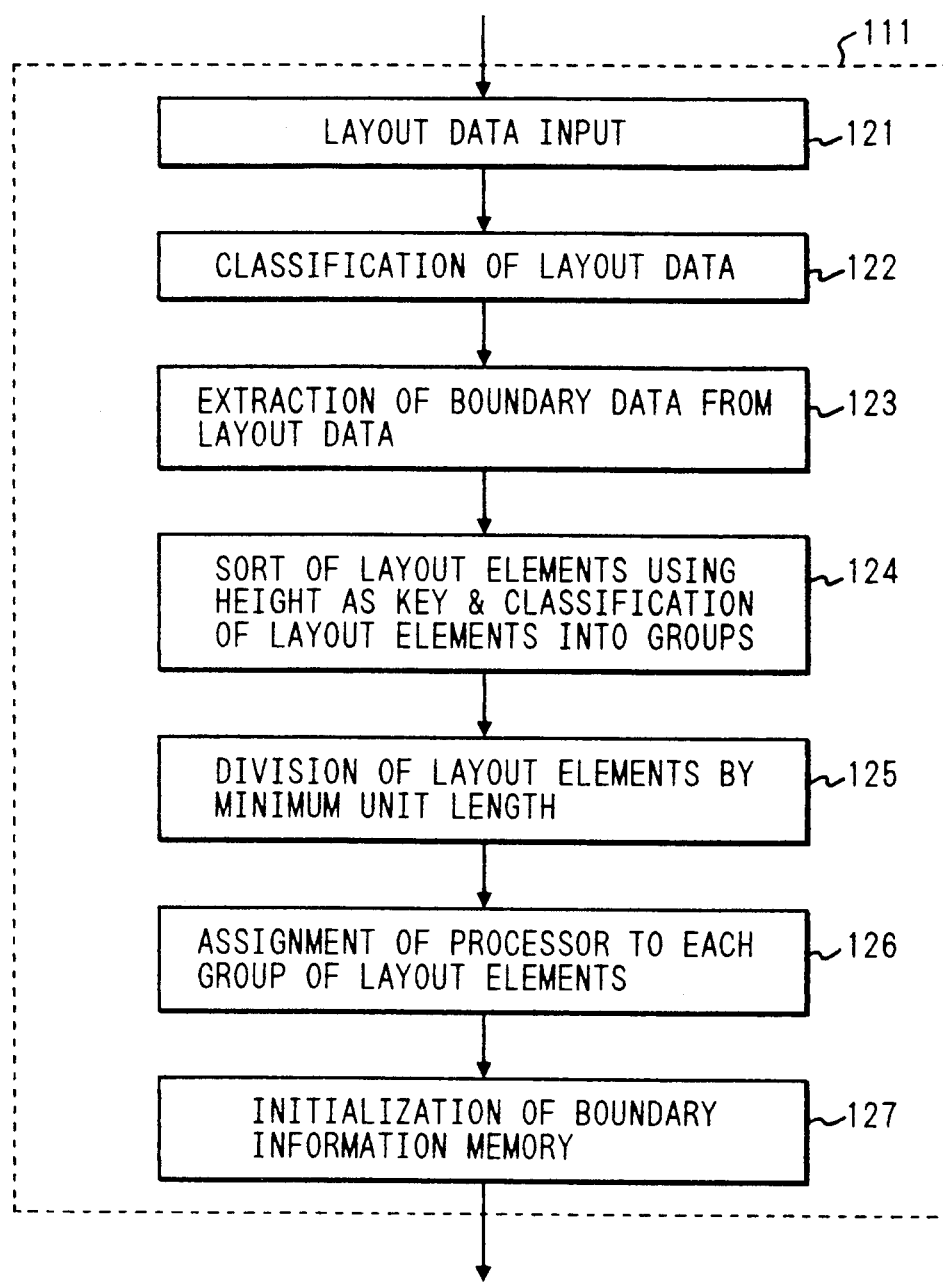
FIG. 12 is a flowchart of a subprogram for effecting the preprocessing in step 111 of FIG. 11.

Referring now to FIG. 11, there is illustrated a flowchart of a program for performing the second embodiment, namely, a second method for layout compaction. In step 111 of this figure, a preprocessing of data representing layout elements is performed. FIG. 12 is a flowchart of a subprogram for effecting the preprocessing in step 111, which is composed of steps 121 to 127. The processings effected in steps 121 to 124 are the same as performed in steps 21 to 24 of FIG. 2, respectively. Namely, in step 121, layout element data, layout area data and data relating to a design rule are inputted. Next, in step 122, the layout elements are classified into horizontal wires, vertical wires and contacts and rectangles. Subsequently, in step 123, the subprogram sets a top boundary T and a bottom boundary B, based on the form of the layout area. Then, in step 124, the layout elements having the same height other than the vertical wires are sorted into groups using vertical coordinates (i.e., heights) as keys, and the layout elements other than the vertical wires are sorted into groups. Next, in step 125, the layout elements of each group is divided by a minimum unit length 1. For example, in case where the length of a layout element is 10 μm and a minimum unit length is 0.1 μm, this layout element is divided into one hundred equal layout elements each of which has a minimum unit length.

Figure 14A:
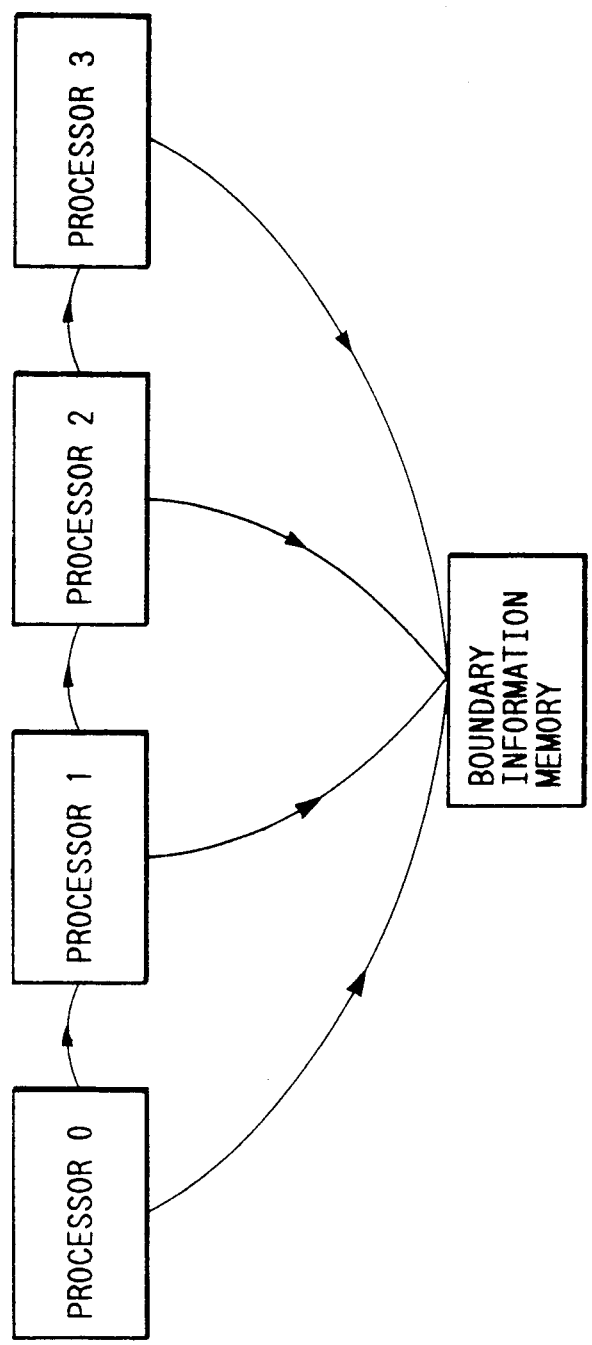
FIG. 14(a) is a diagram for illustrating how processors assigned to groups of layout elements and a boundary information memory are communicated with one another.

Thereafter, in step 126, a processor 0 performs a processing of expanding a bottom boundary B of a layout, and processors 1, 2 and 3 perform processings of the layout elements of groups grid1, grid2 and grid3, respectively, as illustrated in FIG. 14(a). Further, in step 127, the boundary information memory 50 is initially established for the purpose of referring to geometrical information on a bottom boundary RB of a layout element having a minimum unit length.

Figure 15A:
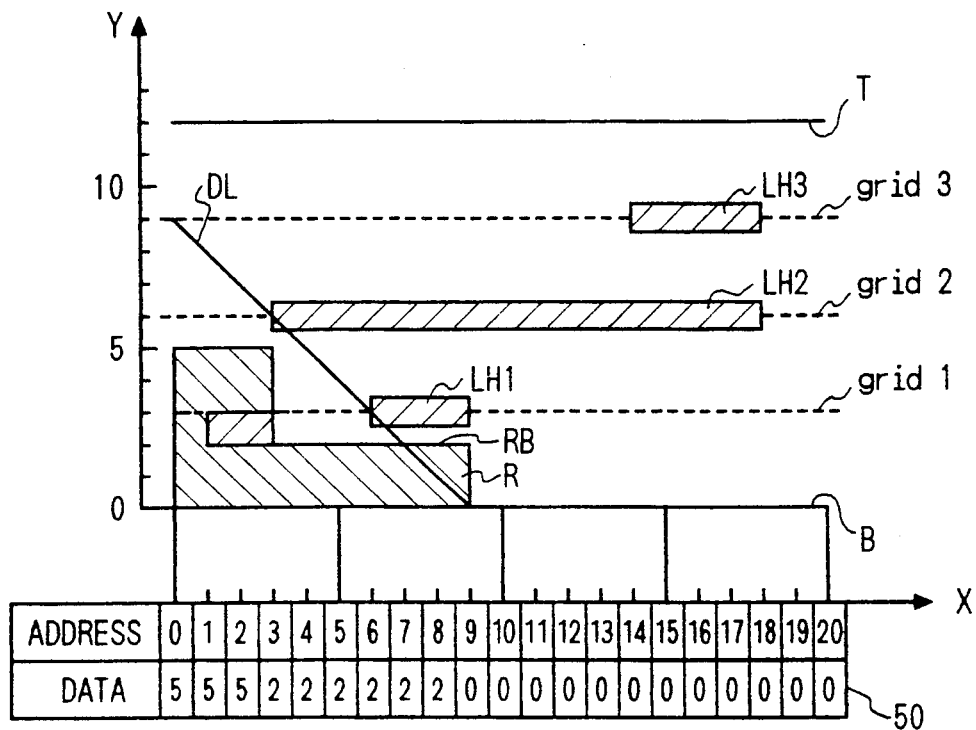
FIGS. 15(a) to 15(e) are diagrams for illustrating how layout elements and the contents of a boundary memory change in a compaction processing of a layout by using the processors of FIG. 14(a) in case of the second embodiment.

Turning back to FIG. 11, in step 112, a processing squeeze-down is effected. FIG. 14(b) is a timing chart for illustrating a compaction processing by each of the processors 0 to 3 from a start to an end thereof. Processor 0 starts expanding the bottom boundary B of the layout at time t=0. Processor 1 begins the compaction processing of the layout elements of the group grid1 at t=ΔW. Processor 2 commences the compaction processing of the layout elements of the group grid2 at t=2ΔW. Processor 3 begins the compaction processing of the layout elements of the group grid3 at t=3ΔW. In passing, ΔW=(a time required to process data stored at an address in the boundary information memory 50) * (a distance required to follow the design rule). In addition, the distance required to follow the design rule is a sum of the design rule expressed in terms of the minimum unit distance (2 in this case) and the length of the layout element divided in such a manner to have the minimum unit length (i.e., 1). Namely, the distance required to follow the design rule is 3 in this case. Moreover, it is supposed in this case that the time required to process data stored at an address in the boundary information memory 50 is 1 (namely, employed as a unit time) and thus ΔW=3. As illustrated in FIG. 15(a), when the processor 3 starts the compaction processing of the layout elements of the group grid3, the processor 0 has completed the processing of a part, of which the x-coordinate ranges from 0 to 9, of the layout area, and the processor 1 has finished the processing of another part, of which the x-coordinate ranges from 0 to 6, of the layout area, and the processor 1 has ended the processing of still another part, of which the x-coordinate ranges from 0 to 3, of the layout area. Position information indicating an x-coordinate to which the processing by the processor 0 has been completed is sent to the processor 1, and position information indicating another x-coordinate to which the processing by the processor 1 has been finished is sent to the processor 2, and position information indicating still another x-coordinate to which the processing by the processor 2 has been ended is sent to the processor 3. Each of the processors to which the position information is thus sent recognizes (namely, finds) by what x-coordinate of the layout area the processing can be further performed. In this figure, a scan line DL visually indicates the relative positional relation among the latest x-coordinates of the layout area, to which the processors 0 to 3 have completed the compaction processing.

Figure 13:
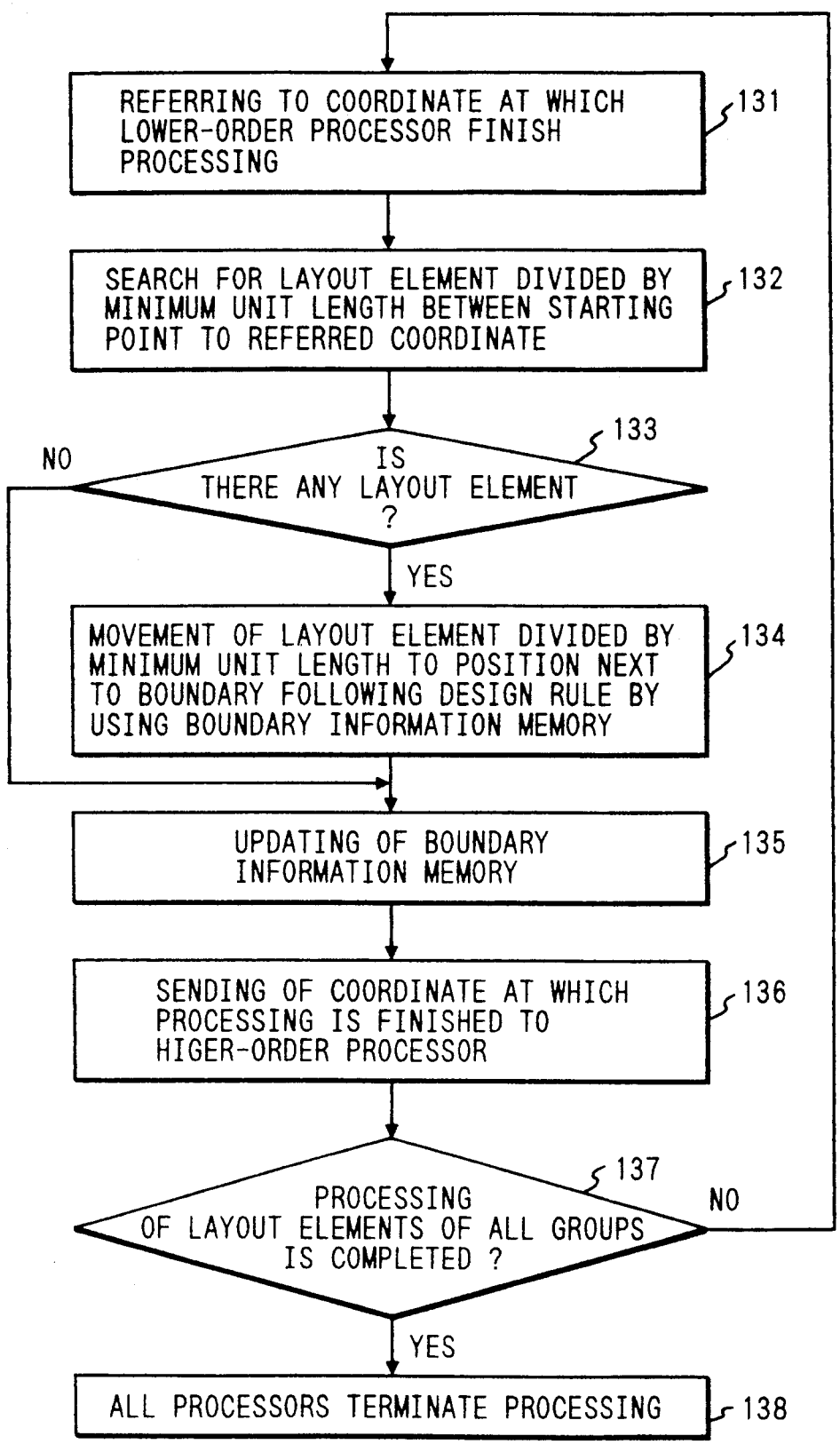
FIG. 13 is a flowchart for illustrating a processing effected in each of the processors, which is common to the packing-element-in-bottom-boundary-region processing in step 112 and the packing-element-in-top-boundary-region processing in step 113 of FIG. 11.

FIG. 13 is a flowchart for illustrating a processing effected in each of the processors, which is common to the packing-element-in-bottom-boundary-region processing in step 112 and the packing-element-in-top-boundary-region processing in step 113. When an object of the processing performed by each of the processors advances by the minimum unit length 1 in the horizontal direction as viewed in FIG. 15 (b), the processors carry out the following processings in parallel with one another. In case of the processor 0, there remain no groups of the layout elements to be processed, differently with cases of the other processors. Therefore, the processor 0 does not need to perform the processings of steps 131 to 134 but starts the processing of step 135. Namely, the processor 0 expands the bottom boundary B at the x-coordinate x=9 and changes the corresponding content of the boundary information memory 50 into 2 in step 135. Incidentally, data stored at an address of 10 in the boundary information memory 50 corresponding the x-coordinate x=10 is not updated. This is because an updating of the contents of the boundary information memory 50 in response to an updating of the boundary RB is performed within the range of the X-coordinate of from a starting point of the boundary of the layout area to be updated to a point which is placed immediately prior to an end point thereof, as described above. Then, information indicating the latest x-coordinate of the part, of which the processing is completed by the processor 0, is transferred to the processor 1. Next, in step 137, if conditions of termination of the processing by the processor 0 are met, the processing is terminated. If not, an object of the processing performed by the processor 0 advances by the minimum unit length 1 in the horizontal direction once again.

Figure 15B:
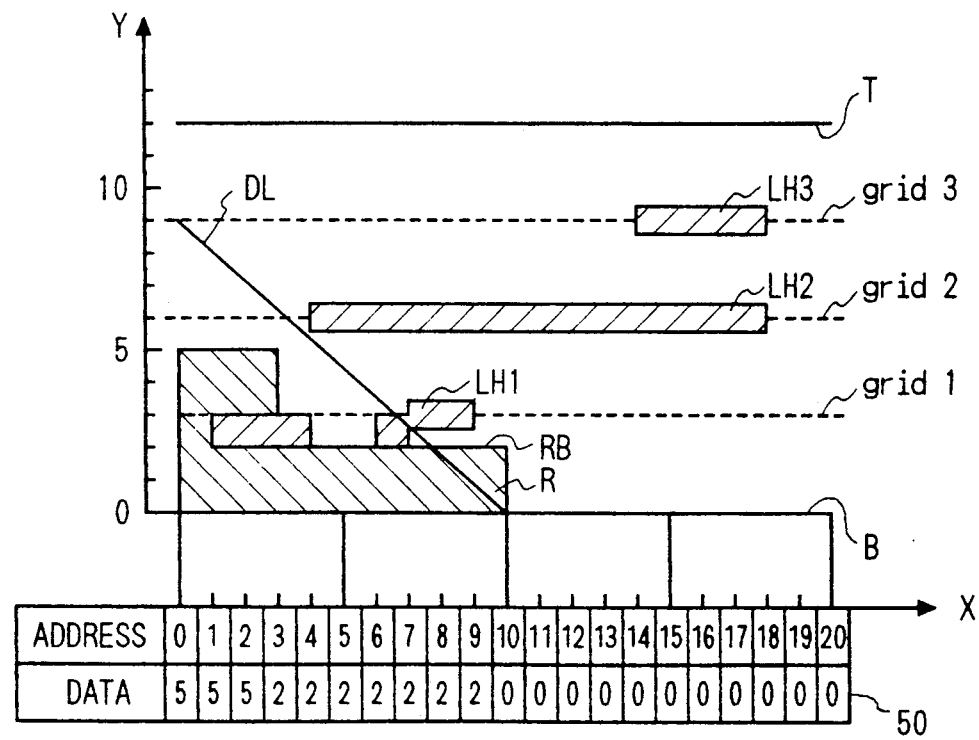
Figure 15C:
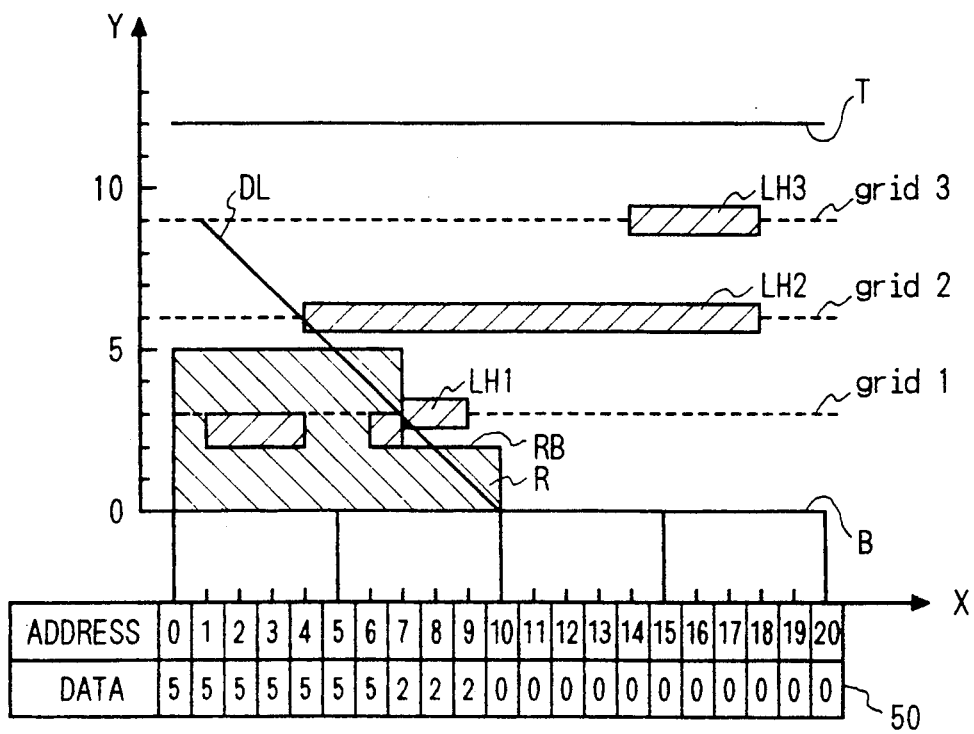

In contrast, the processor 1 refers to the position information on the x-coordinate of the part, of which the processing by the processor 0 is finished, of the layout area and waits until an object of the processing by the processor 0 advances by a distance of 3 (corresponding to ΔW), which is expressed in terms of the minimum unit distance, ahead of the latest position of the layout area, of which the processing by the processor 1 is completed, in the horizontal direction in step 131. When the processing by the processor 0 advances for a time ΔW, the processor 1 searches for the layout elements of the group grid1 in step 132. Subsequently, it is judged in step 133 whether or not there are layout elements generated by dividing the layout element LH1 of the group grid1 by the minimum unit length 1. If such elements are found, the processor 1 refers to the contents of the boundary information memory 50 corresponding to the x-coordinate of the layout element having the minimum unit length and generated by the division of the element LH1 and moves the thus generated elements to positions at which the moved elements are in contact with the boundary RB in step 134 as illustrated in FIG. 15(b). Next, in step 135, the data stored at addresses in the boundary information memory 50 corresponding to the x-coordinates, which are equal to or more than 4 and is less than 6, are updated by being changed from 2 to 5 in such a fashion to be able to follow the design rule as illustrated in FIG. 15(c). Then, in step 136, the processor 1 sends the information on the latest x-coordinate of the part, of which the processing by the processor 1 is completed, of the layout area to the processor 2. Further, it is judged in step 137 whether or not the conditions of termination of the processing by the processor 1 are satisfied. In this case, the conditions of termination of the processing are not satisfied with the processor 1. Consequently, an object of the processing by the processor 1 proceeds by the minimum unit length 1 in the horizontal direction as viewed in this figure.

Further, in step 131, the processor 2 refers to the position information on the x-coordinate of the part, of which the processing by the processor 1 is completed of, the layout area and waits until the processing by the processor 1 advances for a time ΔW in the horizontal direction. Thereafter, if the processing by the processor 1 advances for a time ΔW, the processor 2 searches for the layout elements of the group grid2 in step 132. Subsequently, it is judged in step 133 whether or not there are layout elements generated by dividing the layout element LH2 of the group grid1 by the minimum unit length 1. If such elements are found, the processor 2 refers to the contents of the memory 50 corresponding to the x-coordinates of the layout element each having the minimum unit length and generated by the division of the element LH2 and moves the thus generated elements to positions at which the moved elements are in contact with the boundary RB in step 134 as illustrated in FIG. 15(b). Next, in step 135, the data stored at addresses in the boundary information memory 50 corresponding to the x-coordinates, which are equal to or more than 3 and is less than 4, are updated by being changed from 2 to 5 as illustrated in FIG. 15(c). (The range of the x-coordinate of the boundary RB to be updated is more than and equal to 2 and is less than 4. However, a y-coordinate corresponding to the x-coordinate of 2 is already 5. Thus, there is no necessity of updating in case where the x-coordinate is 2.) Then, in step 136, the processor 2 sends the information on the latest x-coordinate of the part, of which the processing by the processor 2 is completed, of the layout area to the processor 3, similarly as in case of the processor 1. Further, an object of the processing by the processor 2 is made to proceed by the minimum unit length 1 in the horizontal direction.

Figure 15D:
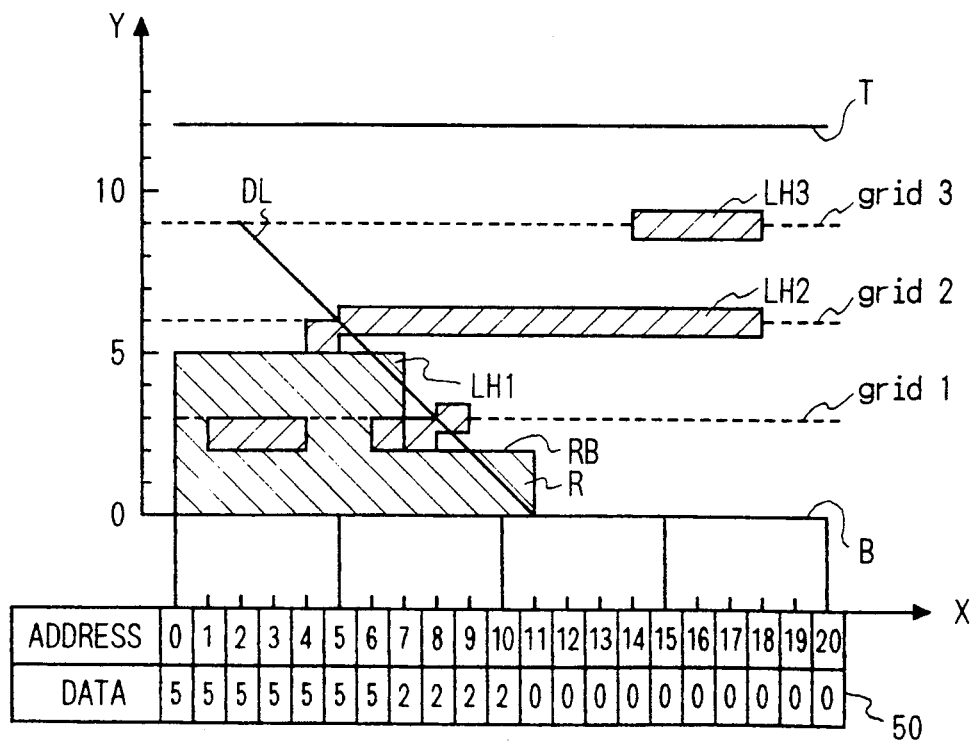
Figure 15E:
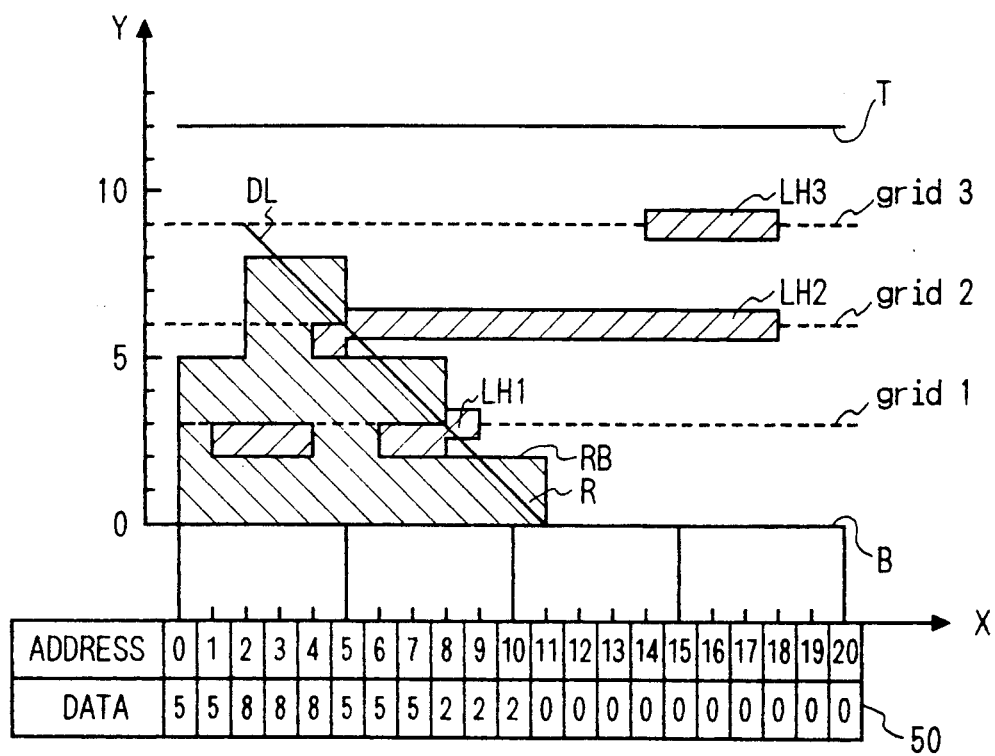

In case of the processor 3, in step 132, no layout elements of the group grid3 to be processed by the processor 3 are found. Thus, the processor 3 need not perform the processings of steps 133 to 135. Moreover, the processor 3 is a processor for processing the highest group of the layout elements, so that the processor 3 need not perform the processing of step 136. FIG. 15(d) shows a state in which an object of the processing further advances by the minimum unit distance 1 ahead of the position thereof shown in FIG. 15(c). Results of the packing-element-in-bottom-boundary-region processing of FIG. 7 are obtained by repeating the above described processing to be effected by each of the processors 0 to 3. The resultant layout of FIG. 9 can be obtained by performing the packing-element-in-top-boundary-region processing in such a manner to remove useless bends of the horizontal wires from the top boundary T of the layout similarly as in case of the packing-element-in-bottom-boundary-region processing.

Incidentally, let N, W and T denote the number of data on objects of the layout compaction, a layout-area width and the number of the groups of the layout elements, respectively. Moreover, the layout elements of the T groups and (T+1) processors are preliminarily provided. Furthermore, an x-coordinate of a position at which each processor currently performs the processing of a corresponding group of the layout elements should not exceed all of x-coordinates of parts, of which the processing is completed by each of other processors, of the layout elements of groups located below the group of the layout elements currently processed by the processor under consideration. Thus there are a delay time in the processing between each pair of the processors and a distance (hereunder referred to as delay distance) between each pair of objects of the processings to be performed by the processors. Let $\Delta w_1$ and $d_u$ designate a time required for a processing of data corresponding to the minimum unit distance 1 and a delay distance required by each processor to follow the design rule. A delay time $\Delta W$ between each pair of the processings of the processors is obtained by:

$$\Delta W = d_u \cdot \Delta W_1 \tag{4}$$

Further, processing times $T_0, T_1, T_2, T_3, \ldots, T_T$ of the processors corresponding to the bottom boundary of the layout to the highest group of the layout elements are respectively given as follows:

$$T_0 = W/u \cdot \Delta w_1$$

$$T_1 = W/u \cdot \Delta W_1 + \Delta W$$

$$T_2 = W/u \cdot \Delta W_1 + 2 \cdot \Delta W$$

$$T_3 = W/u \cdot \Delta W_1 + 3 \cdot \Delta W$$

$$T_4 = W/u \cdot \Delta W_1 + 4 \cdot \Delta W$$

$$\ldots \ldots \ldots \ldots \ldots \ldots \ldots \ldots$$

$$T_T = W/u \cdot \Delta w_1 + T \cdot \Delta W$$

Therefore, a difference in processing time between the processor for performing a processing of the bottom boundary of the layout and the processor for performing a processing of the highest group of the layout elements is equal to $T \cdot \Delta W$. Thus a processing time $T_a$ of an entire system including all of the processors is equal to $T_T$. That is, $$T_a = W/u \cdot \Delta W_1 + T \cdot \Delta W \tag{5}$$

Consequently, time complexity $C_M$ of the processing is $O(W+T)$ and the following inequality is obtained by using the equation (1):

$$C_M = O(W+T) < O(N) = O(W \cdot T) \tag{6}$$

Thus the multiprocessing can be performed very effectively at a high speed. Moreover, in case where the layout has a plurality of layout layers, a boundary information memory can be established correspondingly to each layer. Therefore, this embodiment can be easily applied to a compaction of a layout having a plurality of layout layers.

Incidentally, in case of the second embodiment, the system for performing the method for layout compaction is provided with four processors (namely, the processors 0 to 3). The number of the processors, however, is not limited to four. The system for performing the method for layout compaction may be provided with processors of the number suitably corresponding to the number of groups of layout elements.

While preferred embodiments of the present invention have been described above, it is to be understood that the present invention is not limited thereto and that other modifications will be apparent to those skilled in the art without departing from the spirit of the invention. The scope of the present invention, therefore, is to be determined solely by the appended claims.

What is claimed is:

1. A computer implemented method for layout compaction for generating a minimum layout pattern of an integrated circuit which follows a predetermined design rule by reducing unnecessary spaces in a layout of the integrated circuit as much as possible, said method comprising using a programmed computer to implement the steps of:

establishing storage areas in a direct access memory as a boundary information memory to which geometrical information on bottom and top boundaries of the layout is written;

storing the geometrical information in the storage areas of the direct access memory;

performing a squeeze-down processing by reading the boundary information memory from the storage areas of the direct access memory and searching a layout area for layout elements next to the bottom boundary according to the boundary information and moving each layout element to a position next to the bottom boundary following the design rule and updating the boundary information; and performing a lift-up processing by reading the boundary information from the storage areas of the direct access memory and searching a layout area for layout elements next to the top boundary and moving each layout element to a position following the design rule so as to reduce useless bends and updating the boundary information.

2. A computer implemented method for layout compaction for generating a minimum layout pattern of an integrated circuit which follows a predetermined design rule by reducing unnecessary spaces in a layout of the integrated circuit as much as possible, said method comprising using a programmed computer to implement steps of:

classifying layout elements in terms of coordinates in a direction of height into groups of layout elements of a same height;

establishing storage areas in a direct access memory as a boundary information memory for writing therein geometrical information on boundaries of a layout;

performing a squeeze-down processing to squeeze down each group of the layout elements which have a same height in a y-coordinate according to the design rule by scanning a layout area from a bottom boundary of the layout area to a top boundary by reading boundary information from the memory; and performing a lift-up processing to lift up each group of the layout elements which is employed in the squeeze-down processing, so as to reduce useless bends by scanning the layout area from the top boundary of the layout area to the bottom boundary of the layout area by reading the boundary information from the memory.

3. The computer implemented method of claim 2, wherein the step of performing the squeeze-down processing comprises the further steps of moving an element of a group to a position adjacent to the bottom boundary in accordance with said design rule, and updating the geometrical information on the bottom boundary to include the element moved to the position adjacent to the bottom boundary.

4. A computer implemented method for layout compaction for generating a minimum layout pattern of an integrated circuit which follows a predetermined design rule by reducing unnecessary spaces in a layout of the integrated circuit as much as possible, said method comprising using a programmed computer to implement steps of:

classifying layout elements included in the layout of the integrated circuit in terms of coordinates in a direction of height into groups of layout elements of a same height;

establishing storage areas in a direct access memory as a boundary information memory to which geometrical information on boundaries of a layout is written;

storing the geometrical information in the storage areas of the direct access memory;

assigning programmed processors to the groups of the layout elements obtained by the classification, respectively; and performing a squeeze-down processing and a lift-up processing on each group of the layout elements obtained by the classification independently from the processings on the other groups of layout elements by providing a delay among the processings effected by the processors on the groups of layout elements, each of the processors performing the squeeze-down processing and the lift-up processing by reading and updating the boundary information stored in the storage areas of the direct access memory.

5. A computer implemented method for layout compaction for generating a minimum layout pattern of an integrated circuit which follows a predetermined design rule by reducing unnecessary spaces in a layout of the integrated circuit as much as possible, said method comprising using a programmed computer to implement steps of:

classifying layout elements included in the layout of the integrated circuit in terms of coordinates in a direction of height into groups of layout elements of a same height;

establishing storage areas in a direct access memory as a boundary information memory to which geometrical information on bottom and top boundaries of a layout is written;

storing the geometrical information in the storage areas of the direct access memory;

performing the squeeze-down processing by reading boundary information from the storage areas of the direct access memory and searching a layout area for layout elements of each group, which have a same height in the direction of height and are next to the bottom boundary, according to the boundary information and moving each layout element of every group to a position next to the bottom boundary following the design rule and updating the boundary information; and performing the lift-up processing by reading the boundary information from the storage areas of the direct access memory and searching a layout area for layout elements next to the top boundary and moving each layout element to a position following the design rule so as to reduce useless bends and updating the boundary information.

6. The computer implemented method of claim 5, wherein the step of performing the squeeze-down processing comprises the further step of establishing bending points in wiring elements.

7. The computer implemented method of claim 6, wherein the step of establishing bending points comprises moving a portion of a horizontal wiring element to the bottom boundary and establishing a vertical wiring element to connect the moved portion to a remaining portion of the wiring element.

* * * * *